(12) United States Patent
Kim

(10) Patent No.: US 11,495,272 B2
(45) Date of Patent: Nov. 8, 2022

(54) ELECTRONIC DEVICE CONFIGURED TO PERFORM AN AUTO-PRECHARGE OPERATION

(71) Applicant: SK hynix Inc., Icheon-si (KR)

(72) Inventor: Woongrae Kim, Icheon-si (KR)

(73) Assignee: SK hynix Inc., Icheon-si (KR)

(*) Notice: Subject to any disclaimer, the term of this patent is extended or adjusted under 35 U.S.C. 154(b) by 46 days.

(21) Appl. No.: 17/158,413

(22) Filed: Jan. 26, 2021

(65) Prior Publication Data
US 2022/0036930 A1 Feb. 3, 2022

(30) Foreign Application Priority Data
Jul. 30, 2020 (KR) .......................... 10-2020-0095469

(51) Int. Cl.
*G11C 7/10* (2006.01)
*G11C 7/22* (2006.01)

(52) U.S. Cl.
CPC ............ *G11C 7/1087* (2013.01); *G11C 7/106* (2013.01); *G11C 7/1039* (2013.01); *G11C 7/1048* (2013.01); *G11C 7/222* (2013.01)

(58) Field of Classification Search
CPC ... G11C 7/1087; G11C 7/1039; G11C 7/1048; G11C 7/106; G11C 7/222

USPC .................................................. 365/189.05
See application file for complete search history.

(56) References Cited

U.S. PATENT DOCUMENTS

| | | | |
|---|---|---|---|
| 9,171,600 B2 | 10/2015 | Shimizu et al. | |
| 10,734,042 B2* | 8/2020 | Kim | ................... G11C 7/109 |
| 2018/0096716 A1* | 4/2018 | Min | ..................... G11C 7/12 |
| 2022/0044716 A1* | 2/2022 | Kim | .................... G11C 7/1096 |

FOREIGN PATENT DOCUMENTS

KR 1020030012558 A 2/2003

* cited by examiner

*Primary Examiner* — Connie C Yoha
(74) *Attorney, Agent, or Firm* — William Park & Associates Ltd.

(57) ABSTRACT

An electronic device may include: an input/output control signal generation circuit configured to generate an input control signal and a first output control signal during a write operation, and generate a second output control signal during a write operation with an auto-precharge operation; and a bank address output circuit configured to latch a bank address based on the input control signal, and output the latched bank address as a write bank address for the write operation or a precharge bank address for the auto-precharge operation, based on the first output control signal and the second output control signal.

22 Claims, 26 Drawing Sheets

FIG. 4

| OPERATION | CLK EDGE | CS | CA<1> | CA<2> | CA<3> | CA<4> | CA<5> | CA<6> |
|---|---|---|---|---|---|---|---|---|
| WRITE | Rising 1 | H | L | L | H | L | L | X |
| | Rising 2 | L | BA<1> | BA<2> | BA<3> | X | X | AP |
| | Rising 3 | H | L | H | L | L | H | X |
| | Rising 4 | L | CADD<1> | CADD<2> | CADD<3> | CADD<4> | CADD<5> | CADD<6> |

ELECTRONIC DEVICE CONFIGURED TO PERFORM AN AUTO-PRECHARGE OPERATION

CROSS-REFERENCES TO RELATED APPLICATION

The present application claims priority to Korean application number 10-2020-0095469, filed on Jul. 30, 2020, which is incorporated by reference in its entirety.

BACKGROUND

1. Technical Field

Various embodiments generally relate to an electronic device configured to perform an auto-precharge operation.

2. Related Art

Among electronic devices, a semiconductor device may perform an auto-precharge operation. The auto-precharge operation may indicate a precharge operation which is automatically performed from a command generated in the semiconductor device, after a write operation is performed. In the semiconductor device, a memory bank selected according to a combination of a write bank address may perform a write operation, and a memory bank selected according to a combination of a precharge bank address may perform an auto-precharge operation. When performing a write operation with an auto-precharge operation, the semiconductor device outputs a precharge bank address after a write recovery time elapses from the point of time that the write bank address is output. The write recovery time indicates a period of time from the point of time that the semiconductor device receives all data from a controller to the point of time that the semiconductor device completely stores the received data in memory cells.

SUMMARY

In an embodiment, an electronic device may include: an input/output control signal generation circuit configured to generate an input control signal and a first output control signal during a write operation, and generate a second output control signal during a write operation with an auto-precharge operation; and a bank address output circuit configured to latch a bank address based on the input control signal, and output the latched bank address as a write bank address for the write operation or a precharge bank address for the auto-precharge operation, based on the first output control signal and the second output control signal.

In an embodiment, an electronic device may include: an input control signal generation circuit configured to generate an input control signal when an internal write signal is input during a write operation; an output control signal generation circuit configured to generate an output control signal based on a normal write flag signal and a recovery flag signal, when a write operation with an auto-precharge operation is performed; and a bank address output circuit configured to latch a bank address based on the input control signal and output the latched bank address as a precharge bank address for an auto-precharge operation, based on the output control signal.

BRIEF DESCRIPTION OF THE DRAWINGS

FIG. 4 is a table for describing the logic levels of a chip select signal and a command address for performing a write operation and an auto-precharge operation in the electronic device illustrated in FIG. 2.

DETAILED DESCRIPTION

Figure 1:
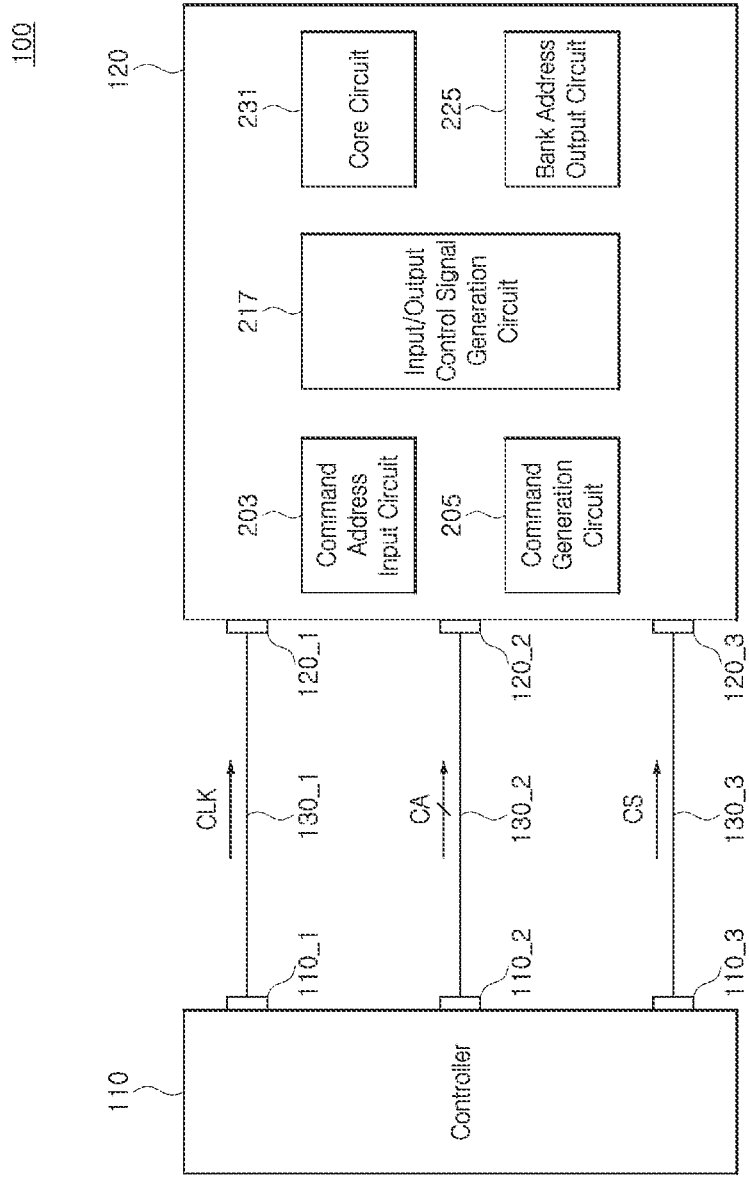
FIG. 1 is a block diagram illustrating a configuration of an electronic system in accordance with an embodiment.

The term "preset" indicates that the numerical value of a parameter is previously decided, when the parameter is used in a process or algorithm. According to an embodiment, the numerical value of the parameter may be set when the process or algorithm is started or while the process or algorithm is performed.

The terms such as "first" and "second", which are used to distinguish among various components, are not limited by the components. For example, a first component may be referred to as a second component, and vice versa.

When one component is referred to as being "coupled" or "connected" to another component, it may indicate that the components are directly coupled or connected to each other or coupled or connected to each other through another component interposed therebetween. On the other hand, when one component is referred to as being "directly coupled" or "directly connected" to another component, it may indicate that the components are directly coupled or connected to each other without another component interposed therebetween.

"Logic high level" and "logic low level" are used to describe the logic levels of signals. A signal having "logic high level" is distinguished from a signal having "logic low level". For example, when a signal having a first voltage corresponds to a signal having "logic high level", a signal having a second voltage may correspond to a signal having "logic low level". According to an embodiment, "logic high level" may be set to a voltage higher than "logic low level". According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Hereafter, the present disclosure will be described through embodiments. The embodiments are only used to exemplify the present disclosure, and the scope of the present disclosure is not limited by the embodiments.

Various embodiments may be directed to an electronic device configured to perform an auto-precharge operation.

In accordance with some embodiments, the electronic device may share the bank address output circuit for write, which outputs the write bank address BA_WT, and the bank address output circuit for precharge, which outputs the precharge bank address BA_AP, when the write operation with the auto-precharge operation is performed, thereby reducing an area and power consumed by the bank address output circuit.

Furthermore, an electronic device may share the input control signal generation circuit for write and precharge, which controls an input of the bank address, when the write operation with the auto-precharge operation is performed, thereby reducing an area and power consumed by the input control signal generation circuit.

FIG. 1 is a block diagram illustrating a configuration of an electronic system 100 in accordance with an embodiment. As illustrated in FIG. 1, the electronic system 100 may include a controller 110 and an electronic device 120.

The controller 110 may include a first control pin 110_1, a second control pin 110_2 and a third control pin 110_3. The electronic device 120 may include a first device pin 120_1, a second device pin 120_2 and a third device pin 120_3. The controller 110 may transmit a clock signal CLK to the electronic device 120 through a first transmission line 130_1 coupled between the first control pin 110_1 and the first device pin 120_1. The controller 110 may transmit a command address CA to the electronic device 120 through a second transmission line 130_2 coupled between the second control pin 110_2 and the second device pin 120_2. The controller 110 may transmit a chip select signal CS to the electronic device 120 through a third transmission line 130_3 coupled between the third control pin 110_3 and the third device pin 120_3.

The electronic device 120 may include a command address input circuit 203, a command generation circuit 205, an input/output control signal generation circuit 217, a bank address output circuit 225 and a core circuit 231. The electronic device 120 may be implemented as a semiconductor device. The electronic device 120 may receive the clock signal CLK, the command address CA and the chip select signal CS from the controller 110, and perform various internal operations including a write operation and an auto-precharge operation.

The electronic device 120 may include a command address input circuit 203 which generates a bank address (BA of FIG. 2) and an auto-precharge signal (AP of FIG. 2) for the auto-precharge operation, based on the command address CA and the chip select signal CS.

Figure 2:
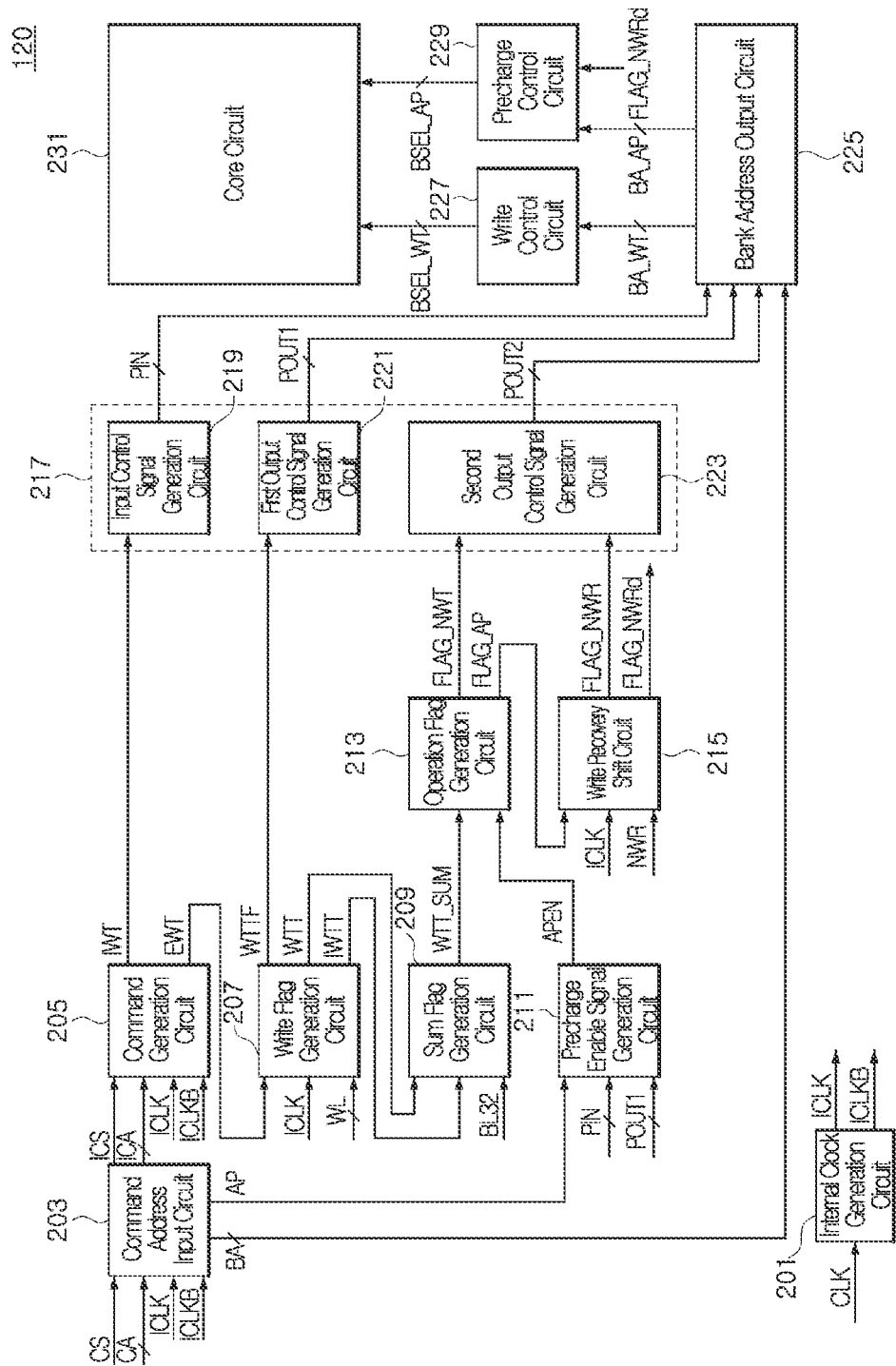
FIG. 2 is a block diagram illustrating a configuration of an embodiment of an electronic device included in the electronic system illustrated in FIG. 1.

The electronic device 120 may include a command generation circuit 205 which generates a write signal (EWT of FIG. 2) for a write operation, based on an internal command address (ICA of FIG. 2) and an internal chip select signal (ICS of FIG. 2).

The electronic device 120 may include an input/output control signal generation circuit 217 which generates an input control signal (PIN of FIG. 2) and a first output control signal (POUT1 of FIG. 2) during a write operation, and generates a second output control signal (POUT2 of FIG. 2) during a write operation with an auto-precharge operation.

The electronic device 120 may include a bank address output circuit 225 which receives the bank address (BA of FIG. 2) in response to the input control signal (PIN of FIG. 2), and outputs a write bank address (BA_WT of FIG. 2) or a precharge bank address (BA_AP of FIG. 2) based on the first output control signal (POUT1 of FIG. 2) and the second output control signal (POUT2 of FIG. 2). Thus, the electronic device 120 in accordance with an embodiment of the present disclosure may share the bank address output circuit 225 for write, which outputs the write bank address (BA_WT of FIG. 2) and the bank address output circuit 225 for precharge, which outputs the precharge bank address (BA_AP of FIG. 2), when performing the write operation with the auto-precharge operation, thereby reducing an area and power consumed by the bank address output circuit 225. Furthermore, the electronic device 120 in accordance with the present embodiments may share an input control signal generation circuit (219 of FIG. 2) for write and precharge, which controls an input of the bank address (BA of FIG. 2), when performing the write operation with the auto-precharge operation, thereby reducing an area and power consumed by the input control signal generation circuit (219 of FIG. 2).

The electronic device 120 may include a core circuit 231 in which a bank selected according to the write bank address (BA_WT of FIG. 2) performs the write operation, and a bank selected according to the precharge bank address (BA_AP of FIG. 2) performs the auto-precharge operation.

The electronic device 120 may perform the write operation with the auto-precharge operation, when the write signal (EWT of FIG. 2) for performing the write operation is enabled and the auto-precharge signal (AP of FIG. 2) for performing the auto-precharge operation is enabled. The electronic device 120 may perform a normal write operation, when the write signal (EWT of FIG. 2) for performing the write operation is enabled and the auto-precharge signal (AP of FIG. 2) for performing the auto-precharge operation is disabled.

FIG. 2 is a block diagram illustrating a configuration of an embodiment of the electronic device 120. As illustrated in FIG. 2, the electronic device 120 may include an internal clock generation circuit 201, a command address input circuit 203, a command generation circuit 205, a write flag generation circuit 207, a sum flag generation circuit 209, a precharge enable signal generation circuit 211, an operation flag generation circuit 213, a write recovery shift circuit 215, an input/output control signal generation circuit 217, a bank address output circuit 225, a write control circuit 227, a precharge control circuit 229 and a core circuit 231.

The internal clock generation circuit 201 may generate an internal clock signal ICLK and an inverted internal clock signal ICLKB based on the clock signal CLK. The internal clock signal ICLK may be in phase with the clock signal CLK. The inverted internal clock signal ICLKB may be exactly out of phase from the clock signal CLK. The phases and frequencies of the internal clock signal ICLK and the inverted internal clock signal ICLKB may be set in various manners in accordance with embodiments. The operation in which the internal clock generation circuit 201 generates the internal clock signal ICLK and the inverted internal clock signal ICLKB will be described below with reference to FIG. 3.

The command address input circuit 203 may generate the internal chip select signal ICS from the chip select signal CS in synchronization with the internal clock signal ICLK. The command address input circuit 203 may generate the internal command address ICA from the command address CA in synchronization with the internal clock signal ICLK. The command address input circuit 203 may generate the bank address BA and the auto-precharge signal AP for the auto-precharge operation from the command address CA in synchronization with the inverted internal clock signal ICLKB. According to an embodiment, the number of bits included in the command address CA may be set to various values. The configuration and operation of the command address input circuit 203 will be described with reference to FIG. 5.

The command generation circuit 205 may generate an internal write signal IWT and the write signal EWT based on the internal chip select signal ICS and the internal command address ICA in synchronization with the internal clock signal ICLK and the inverted internal clock signal ICLKB. The command generation circuit 205 may sequentially generate the internal write signal IWT and the write signal EWT based on the internal chip select signal ICS and the internal command address ICA which have logic levels for performing the write operation. The internal write signal IWT may be enabled to generate the input control signal PIN for controlling an input of the bank address BA and the auto-precharge signal AP, when the write operation is performed. The write signal EWT may be enabled to generate a pre-write flag signal WTTF, a write flag signal WTT and an internal write flag signal IWTT, when the write operation is performed. The configuration and operation of the command generation circuit 205 will be described below with reference to FIG. 6.

The write flag generation circuit 207 may sequentially generate the pre-write flag signal WTTF, the write flag signal WTT and the internal write flag signal IWTT by shifting the write signal EWT based on a write latency signal WL in synchronization with the internal clock signal ICLK. The write latency signal WL may be extracted from information stored in a mode register (not illustrated), and include bits having logic level combinations corresponding to write latency intervals, respectively. The write flag generation circuit 207 may generate the write flag signal WTT and the internal write flag signal IWTT by shifting the write signal EWT by an interval obtained by adding the write latency interval and an interval corresponding to a burst length. The burst length may include a first burst length and a second burst length. According to an embodiment, the first burst length may be set to N, and the second burst length may be set to 2N, where N may be set to a natural number equal to or more than 2. The interval corresponding to the first burst length may include an N/M period interval of the internal clock signal ICLK, when the first burst length is set to N. The interval corresponding to the second burst length may include a 2N/M period interval of the internal clock signal ICLK, when the second burst length is set to 2N, wherein M may be set to a natural number.

The write flag generation circuit 207 may generate the write flag signal WTT by shifting the write signal EWT by an interval obtained by adding the write latency interval and the interval corresponding to the first burst length. The write flag generation circuit 207 may generate the internal write flag signal IWTT by shifting the write signal EWT by an interval obtained by adding the write latency interval and the interval corresponding to the second burst length.

The write flag generation circuit 207 may generate the pre-write flag signal WTTF by shifting the write signal EWT by an interval smaller than an interval obtained by adding the write latency interval and the interval corresponding to the first burst length. The pre-write flag signal WTTF may be enabled to generate the first output control signal POUT1 for controlling an output of the bank address BA and the auto-precharge signal AP. The points of time that the pre-write flag signal WTTF, the write flag signal WTT and the internal write flag signal IWTT are generated may be set in various manners according to an embodiment. The configuration and operation of the write flag generation circuit 207 will be described below with reference to FIG. 7.

The sum flag generation circuit 209 may generate one of the write flag signal WTT and the internal write flag signal IWTT as a sum write flag signal WTT_SUM based on a burst mode signal BL32. The burst mode signal BL32 may be extracted from information stored in a mode register (not illustrated), and include information on the burst length. The burst mode signal BL32 may be disabled with the burst length set to the first burst length, and enabled with the burst length set to the second burst length. The sum flag generation circuit 209 may output the write flag signal WTT as the sum write flag signal WTT_SUM when the burst mode signal BL32 is disabled. The sum flag generation circuit 209 may output the internal write flag signal IWTT as the sum write flag signal WTT_SUM when the burst mode signal BL32 is enabled. That is, the sum write flag signal WTT_SUM may be generated by shifting the write signal EWT by an interval obtained by adding the write latency interval and the interval corresponding to the burst length. The configuration and operation of the sum flag generation circuit 209 will be described below with reference to FIG. 10.

The precharge enable signal generation circuit 211 may generate a precharge enable signal APEN from the auto-precharge signal AP based on the input control signal PIN and the first output control signal POUT1. The precharge enable signal generation circuit 211 may latch the auto-precharge signal AP based on the input control signal PIN, and output the latched auto-precharge signal AP as the precharge enable signal APEN based on the first output control signal POUT1. The input control signal PIN may be enabled to control an input of the auto-precharge signal AP when the internal write signal IWT is enabled. The first output control signal POUT1 may be enabled to control an output of the auto-precharge signal APEN when the pre-write flag signal WTTF is enabled. The pre-charge enable signal APEN may be enabled from the point of time that the pre-write flag signal WTTF is enabled, when the write operation with the auto-precharge operation is performed. The configuration and operation of the precharge enable signal generation circuit 211 will be described below with reference to FIG. 11.

The operation flag generation circuit 213 may output the sum write flag signal WTT_SUM as a normal write flag signal FLAG_NWT or a precharge flag signal FLAG_AP, depending on whether to perform the auto-precharge operation based on the precharge enable signal APEN. The operation flag generation circuit 213 may enable the normal write flag signal FLAG_NWT and disable the precharge flag signal FLAG_AP, during the normal write operation. The operation flag generation circuit 213 may disable the normal write flag signal FLAG_NWT and enable the precharge flag signal FLAG_AP, during the write operation with the auto-precharge operation. That is, the operation flag generation circuit 213 may enable one of the normal write flag signal FLAG_NWT and the precharge flag signal FLAG_AP according to whether the auto-precharge operation is performed. The configuration and operation of the operation flag generation circuit 213 will be described with reference to FIG. 12.

The write recovery shift circuit 215 may generate a recovery flag signal FLAG_NWR by shifting the precharge flag signal FLAG_AP by the write recovery interval based on a write recovery signal NWR in synchronization with the internal clock signal ICLK. For example, when the write recovery interval is an interval of 30 periods of the internal clock signal ICLK, the write recovery shift circuit 215 may generate the recovery flag signal FLAG_NWR by shifting the precharge flag signal FLAG_AP by an interval of 30 periods of the internal clock signal ICLK. The write recovery signal NWR may be extracted from information stored in the mode register (not illustrated), and include bits having logic level combinations corresponding to write recovery intervals, respectively. The recovery flag signal FLAG_NWR may be enabled to generate the second output control signal POUT2 for controlling an output of the precharge bank address BA_AP, when the write operation with the auto-precharge operation is performed. The write recovery shift circuit 215 may generate a delay recovery flag signal FLAG_NWRd by delaying the recovery flag signal FLAG_NWR by a preset interval. The delay recovery flag signal FLAG_NWRd may be enabled to generate a pre-charge bank select signal BSEL_AP. The configuration and operation of the write recovery shift circuit 215 will be described below with reference to FIG. 13.

The input/output control signal generation circuit 217 may include an input control signal generation circuit 219, a first output control signal generation circuit 221 and a second output control signal generation circuit 223. The input/output control signal generation circuit 217 may generate the input control signal PIN based on the internal write signal IWT, when the write operation is performed. The input control signal PIN may be enabled to control an input of the bank address BA when the internal write signal IWT generated during the write operation is enabled. The input/output control signal generation circuit 217 may generate the first output control signal POUT1 based on the pre-write flag signal WTTF, when the write operation is performed. The first output control signal POUT1 may be enabled to control an output of the write bank address BA_WT when the pre-write flag signal WTTF generated based on the write signal EWT is enabled. The input/output control signal generation circuit 217 may generate the second output control signal POUT2 based on the normal write flag signal FLAG_NWT and the recovery flag signal FLAG_NWR, when the write operation with the auto-precharge operation is performed. The second output control signal POUT2 may be enabled to control an output of the precharge bank address BA_AP when the recovery flag signal FLAG_NWR is enabled during the write operation with the auto-precharge operation. The second output control signal POUT2 may be disabled when the normal write flag signal FLAG_NWT is enabled during the normal write operation.

The input control signal generation circuit 219 may generate the input control signal PIN, when the internal write signal IWT is input during the write operation. The input control signal generation circuit 219 may generate the input control signal PIN by counting the number of times that the internal write signal IWT is input, when the write operation is performed. The input control signal PIN may include a plurality of bits. For example, the input control signal generation circuit 219 may enable a first bit PIN<1> of the input control signal when the internal write signal IWT is input for the first time, and enable a second bit PIN<2> of the input control signal when the internal write signal IWT is input for the second time. The configuration and operation of the input control signal generation circuit 219 will be described below with reference to FIG. 14.

The first output control signal generation circuit 221 may generate the first output control signal POUT1 when the pre-write flag signal WTTF is input during the write operation. The first output control signal generation circuit 221 may generate the first output control signal POUT1 by counting the number of times that the pre-write flag signal WTTF is input, when the write operation is performed. The first output control signal POUT1 may include a plurality of bits. For example, the first output control signal generation circuit 221 may enable a first bit POUT1<1> of the first output control signal when the pre-write flag signal WTTF is input for the first time, and enable a second bit POUT<2> of the first output control signal when the pre-write flag signal WTTF is input for the second time. The configuration and operation of the first output control signal generation circuit 221 will be described below with reference to FIG. 15.

The second output control signal generation circuit 223 may generate the second output control signal POUT2 based on the normal write flag signal FLAG_NWT and the recovery flag signal FLAG_NWR, when the write operation with the auto-precharge operation is performed. The second output control signal generation circuit 223 may disable the second output control signal POUT2 when the normal write flag signal FLAG_NWT is enabled during the normal write operation. The second output control signal generation circuit 223 may enable the second output control signal POUT2 when the recovery flag signal FLAG_NWR is enabled during the write operation with the auto-precharge operation.

The second output control signal generation circuit 223 may generate the second output control signal POUT2 by counting the number of times that one of the normal write flag signal FLAG_NWT and the recovery flag signal FLAG_NWR is input, when the write operation with the auto-precharge operation is performed. The second output control signal POUT2 may include a plurality of bits. For example, the second output control signal generation circuit 223 may enable a first count output signal (CNT_OUT<1> of FIG. 16), and disable a first bit POUT2<1> of the second output control signal, when the normal write flag signal FLAG_NWT is input during the normal write operation. Then, the second output control signal generation circuit 223 may enable a second count output signal (CNT_OUT<2> of FIG. 16), and enable a second bit POUT2<2> of the second output control signal, when the recovery flag signal FLAG_NWR is input during the write operation with the auto-precharge operation. The configuration and operation of the second output control signal generation circuit 223 will be described below with reference to FIG. 16.

The bank address output circuit 225 may latch the bank address BA based on the input control signal PIN. The bank address output circuit 225 may output the write bank address BA_WT for the write operation or the precharge bank address BA_AP for the auto-precharge operation, based on the first output control signal POUT1 and the second output control signal POUT2. The bank address output circuit 225 may output the write bank address BA_WT for the write operation based on the first output control signal POUT1. The bank address output circuit 225 may output the precharge bank address BA_AP for the auto-precharge operation based on the second output control signal POUT2. Thus, the bank address output circuit 225 may output the write bank address BA_WT for the write operation or output the precharge bank address BA_AP for the auto-precharge operation based on the first output control signal POUT1 and the second output control signal POUT2, when the write operation with the auto-precharge operation is performed, thereby sharing the bank address output circuit 225 for write and precharge. Furthermore, the bank address output circuit 225 may latch the bank address BA based on the input control signal PIN when the write operation with the auto-precharge operation is performed, and output the latched bank address BA as the write bank address BA_WT for the write operation or the precharge bank address BA_AP for the auto-precharge operation, thereby sharing the input control signal generation circuit 219 for write and precharge. The configuration and operation of the bank address output circuit 225 will be described below with reference to FIG. 17.

The write control circuit 227 may generate a write bank select signal BSEL_WT by decoding the write bank address BA_WT. The write bank select signal BSEL_WT may be enabled to select a bank which is to perform the write operation, among a plurality of banks included in the core circuit 231. The write bank select signal BSEL_WT may have bits corresponding to the number of banks included in the core circuit 231.

The precharge control circuit 229 may generate the precharge bank select signal BSEL_AP by decoding the precharge bank address BA_AP based on the delay recovery flag signal FLAG_NWRd. The precharge bank select signal BSEL_AP may be enabled to select a bank which is to perform the auto-precharge operation, among the plurality of banks included in the core circuit 231. The precharge bank select signal BSEL_AP may have bits corresponding to the number of banks included in the core circuit 231. The configuration and operation of the precharge control circuit 229 will be described with reference to FIG. 19.

In the core circuit 231, a bank selected according to the write bank select signal BSEL_WT may perform the write operation, and a bank selected according to the precharge bank select signal BSEL_AP may perform the auto-precharge operation. The configuration and operation of the core circuit 231 will be described below with reference to FIG. 21.

Figure 3:
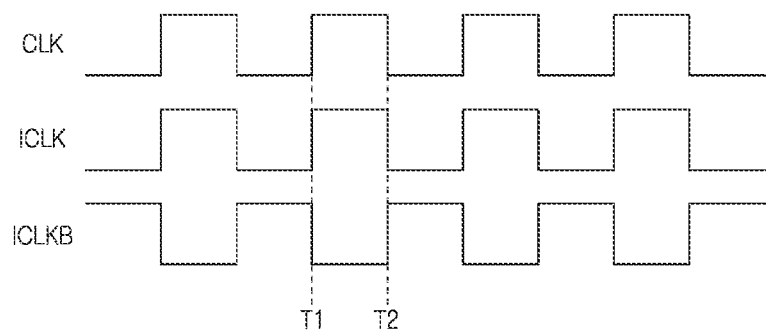
FIG. 3 is a diagram for describing an operation of an internal clock generation circuit included in the electronic device illustrated in FIG. 2.

FIG. 3 is a diagram for describing the operation of the internal clock generation circuit 201. Referring to FIG. 3, the internal clock generation circuit 201 may generate the internal clock signal ICLK which is in phase with the clock signal CLK. The internal clock generation circuit 201 may generate the internal clock signal ICLK which toggles to a logic high level in synchronization with a rising edge T1 of the clock signal CLK. The internal clock generation circuit 201 may generate the inverted internal clock signal ICLKB which is exactly out of phase with the clock signal CLK. The internal clock generation circuit 201 may generate the inverted internal clock signal ICLKB which toggles to a logic high level in synchronization with a falling edge T2 of the clock signal CLK.

FIG. 4 is a table for describing the logic levels of the chip select signal CS and the command address CA for performing the write operation and the auto-precharge operation. Referring to FIG. 4, when the chip select signal CS has a logic high level 'H' at a first rising edge Rising 1 of the clock signal CLK, the electronic device 120 may receive first to fifth command addresses CA<1:5> having a logic level combination 'A', and perform a write operation. The logic level combination 'A' of the first to fifth command addresses CA<1:5> may be set to a logic level combination 'L, L, H, L, L' for performing the write operation at the first rising edge Rising 1 of the clock signal CLK. At this time, a sixth command address CA<6> may be set to don't care 'X' at the first rising edge Rising 1 of the clock signal CLK. The don't care 'X' in FIG. 4 indicates that the write operation has nothing to do with the logic level of the command address CA at the corresponding time point.

When the chip select signal CS has a logic low level 'L' at a second rising edge Rising 2 of the clock signal CLK, the electronic device 120 may receive the first to fifth command addresses CA<1:5>. The first command address CA<1> may be set to a first bank address BA<1> for selecting a bank to perform the write operation or the auto-precharge operation, among the plurality of banks included in the core circuit 231, at the second rising edge Rising 2 of the clock signal CLK. The second command address CA<2> may be set to a second bank address BA<2> for selecting a bank to perform the write operation or the auto-precharge operation, among the plurality of banks included in the core circuit 231, at the second rising edge Rising 2 of the clock signal CLK. The third command address CA<3> may be set to a third bank address BA<3> for selecting a bank to perform the write operation or the auto-precharge operation, among the plurality of banks included in the core circuit 231, at the second rising edge Rising 2 of the clock signal CLK. At this time, the fourth and fifth command addresses CA<4:5> may be set to don't care 'X' at the second rising edge Rising 2 of the clock signal CLK. The sixth command address CA<6> may be set to the auto-precharge signal AP for performing the auto-precharge operation at the second rising edge Rising 2 of the clock signal CLK. The electronic device 120 may perform the write operation with the auto-precharge operation when the sixth command address CA<6> is at a logic high level 'H' at the second rising edge Rising 2 of the clock signal CLK, and perform the normal write operation when the sixth command address CA<6> is at a logic low level 'L' at the second rising edge Rising 2 of the clock signal CLK.

Figure 6:
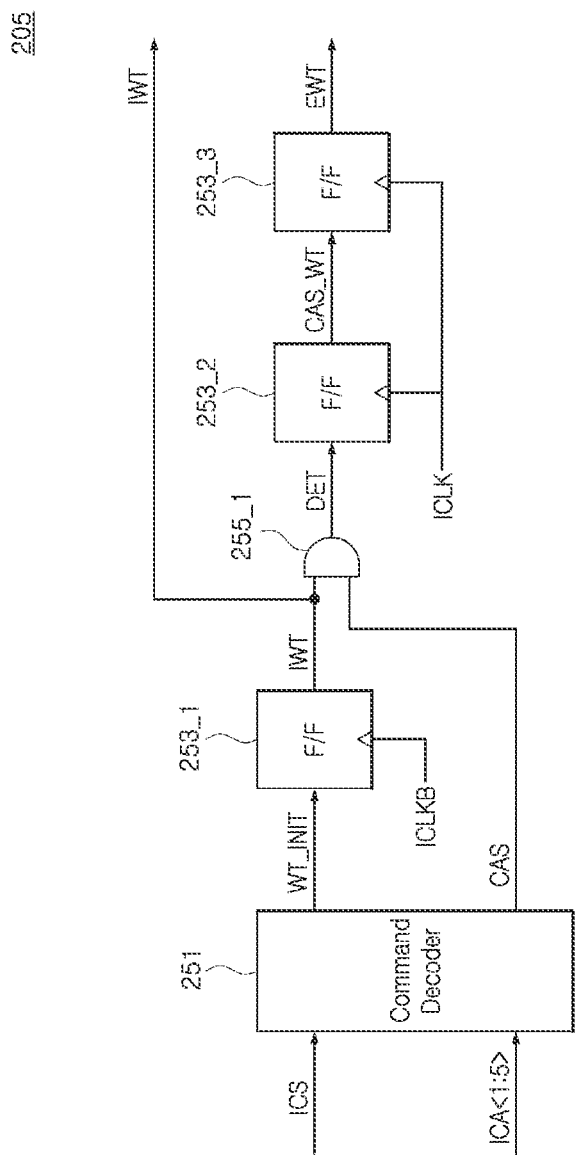
FIG. 6 is a diagram illustrating an embodiment of a command generation circuit included in the electronic device illustrated in FIG. 2.

When the chip select signal CS has a logic high level 'H' at a third rising edge Rising 3 of the clock signal CLK, the electronic device 120 may receive the first to fifth command addresses CA<1:5> having a logic level combination 'B', and generate an internal operation command (CAS of FIG. 6). The logic level combination 'B' of the first to fifth command addresses CA<1:5> may be set to a logic level combination 'L, H, L, L, H' for generating the internal operation command (CAS of FIG. 6) at the third rising edge Rising 3 of the clock signal CLK. At this time, the sixth command address CA<6> may be set to don't care 'X' at the third rising edge Rising 3 of the clock signal CLK.

When the chip select signal CS has a logic low level 'L' at a fourth rising edge Rising 4 of the clock signal CLK, the electronic device 120 may receive the first to fifth command addresses CA<1:5>. The first command address CA<1> may be set to a first column address CADD<1> for selecting a memory cell to perform the write operation, among a plurality of memory cells included in the bank, at the fourth rising edge Rising 4 of the clock signal CLK. The second command address CA<2> may be set to a second column address CADD<2> for selecting a memory cell to perform the write operation, among the plurality of memory cells included in the bank, at the fourth rising edge Rising 4 of the clock signal CLK. The third command address CA<3> may be set to a third column address CADD<3> for selecting a memory cell to perform the write operation, among the plurality of memory cells included in the bank, at the fourth rising edge Rising 4 of the clock signal CLK. The fourth command address CA<4> may be set to a fourth column address CADD<4> for selecting a memory cell to perform the write operation, among the plurality of memory cells included in the bank, at the fourth rising edge Rising 4 of the clock signal CLK. The fifth command address CA<5> may be set to a fifth column address CADD<5> for selecting a memory cell to perform the write operation, among the plurality of memory cells included in the bank, at the fourth rising edge Rising 4 of the clock signal CLK. The sixth command address CA<6> may be set to a sixth column address CADD<6> for selecting a memory cell to perform the write operation, among the plurality of memory cells included in the bank, at the fourth rising edge Rising 4 of the clock signal CLK. An edge EDGE of the clock signal CLK illustrated in FIG. 4 may be set to a falling edge according to an embodiment.

Figure 5:
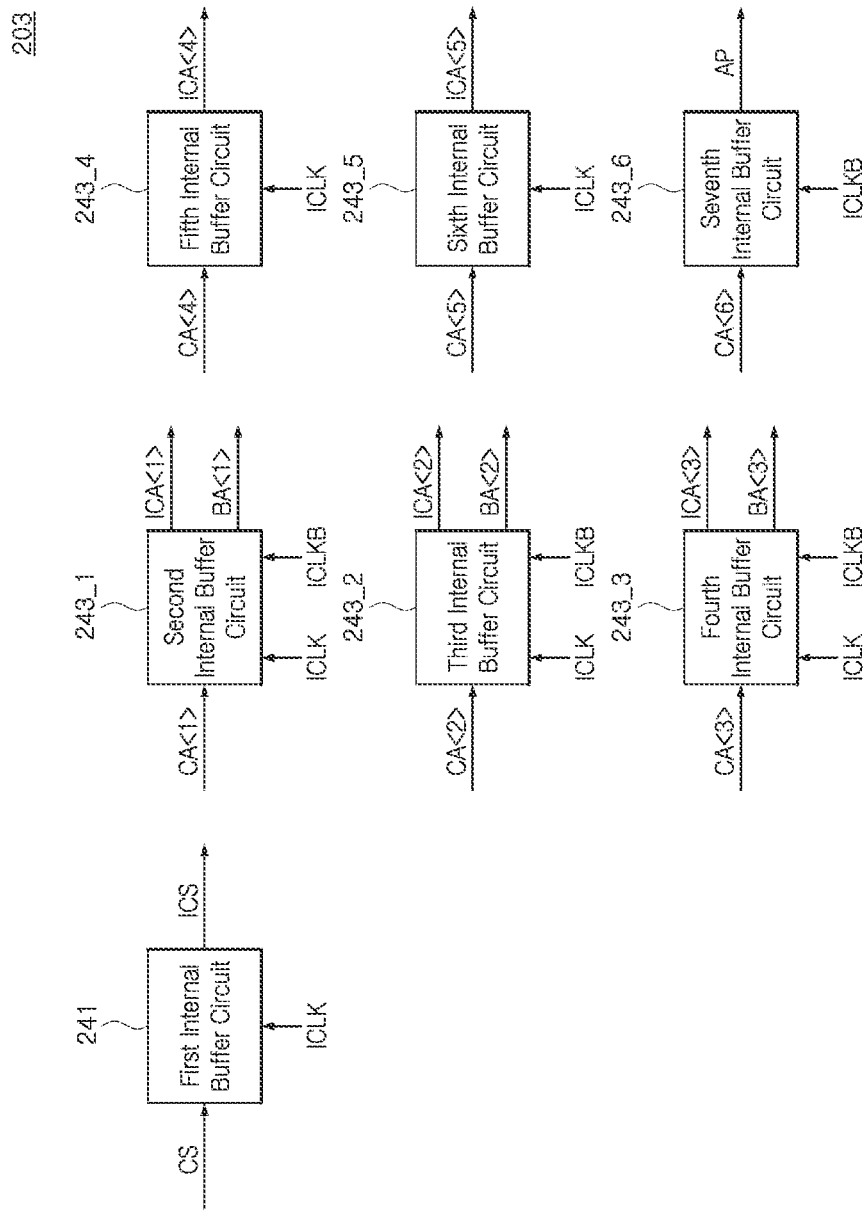
FIG. 5 is a block diagram illustrating a configuration of an embodiment of a command address input circuit included in the electronic device illustrated in FIG. 2.

FIG. 5 is a block diagram illustrating an embodiment of the command address input circuit 203. As illustrated in FIG. 5, the command address input circuit 203 may include a plurality of internal buffer circuits 241 and 243_1 to 243_6.

The first internal buffer circuit 241 may generate the internal chip select signal ICS from the chip select signal CS in synchronization with the internal clock signal ICLK. The second internal buffer circuit 243_1 may generate the first internal command address ICA<1> from the first command address CA<1> in synchronization with the internal clock signal ICLK. The second internal buffer circuit 243_1 may generate a first bank address BA<1> from the first command address CA<1> in synchronization with the inverted internal clock signal ICLKB. The third internal buffer circuit 243_2 may generate a second internal command address ICA<2> from the second command address CA<2> in synchronization with the internal clock signal ICLK. The third internal buffer circuit 243_2 may generate the second bank address BA<2> from the second command address CA<2> in synchronization with the inverted internal clock signal ICLKB. The fourth internal buffer circuit 243_3 may generate a third internal command address ICA<3> from the third command address CA<3> in synchronization with the internal clock signal ICLK. The fourth internal buffer circuit 243_3 may generate the third bank address BA<3> from the third command address CA<3> in synchronization with the inverted internal clock signal ICLKB. The fifth internal buffer circuit 243_4 may generate a fourth internal command address ICA<4> from the fourth command address CA<4> in synchronization with the internal clock signal ICLK. The sixth internal buffer circuit 243_5 may generate a fifth internal command address ICA<5> from the fifth command address CA<5> in synchronization with the internal clock signal ICLK. The seventh internal buffer circuit 243_6 may generate the auto-precharge signal AP from the sixth command address CA<6> in synchronization with the inverted internal clock signal ICLKB.

FIG. 6 is a diagram illustrating an embodiment of the command generation circuit 205. As illustrated in FIG. 6, the command generation circuit 205 may include a command decoder 251, a plurality of flip-flops 253_1 to 253_3 and an AND gate 255_1.

The command decoder 251 may generate a write initialization signal WT_INIT by decoding the first to fifth internal command addresses ICA<1:5> and the internal chip select signal ICS having a logic level for performing the write operation. The command decoder 251 may generate the internal operation command CAS for generating a column address (not illustrated) during the write operation, by decoding the first to fifth internal command addresses ICA<1:5> and the internal chip select signal ICS.

The flip-flop 253_1 may latch the write initialization signal WT_INIT in synchronization with a rising edge of the inverted internal clock signal ICLKB, and output the latched write initialization signal WT_INIT as the internal write signal IWT. The AND gate 255_1 may receive the internal write signal IWT and the internal operation command CAS, perform an AND operation on the received signals, and output a detection signal DET. The flip-flop 253_2 may latch the detection signal DET in synchronization with a rising edge of the internal clock signal ICLK, and output the latched detection signal DET as a CAS write signal CAS_WT. The flip-flop 2533 may latch the CAS write signal CAS_WT in synchronization with a rising edge of the internal clock signal ICLK, and output the latched CAS write signal CAS_WT as the write signal EWT.

Figure 7:
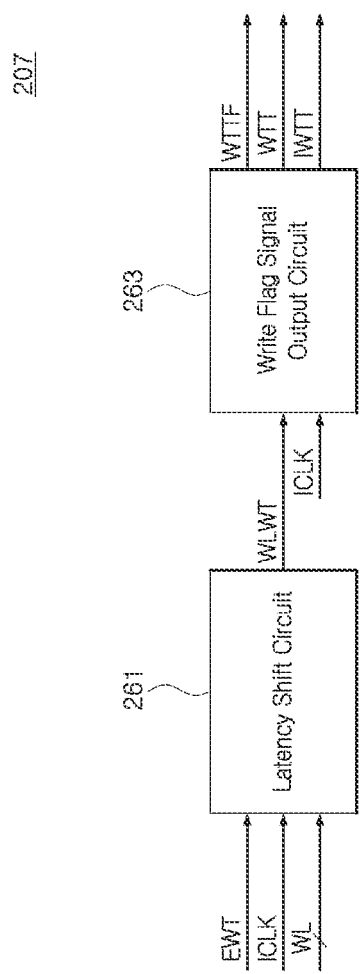
FIG. 7 is a block diagram illustrating a configuration of an embodiment of a write flag generation circuit included in the electronic device illustrated in FIG. 2.

FIG. 7 is a diagram illustrating an embodiment of the write flag generation circuit 207. As illustrated in FIG. 7, the write flag generation circuit 207 may include a latency shift circuit 261 and a write flag signal output circuit 263.

The latency shift circuit 261 may generate a latency write signal WLWT by shifting the write signal EWT based on the write latency signal WL in synchronization with the internal clock signal ICLK. The latency shift circuit 261 may generate the latency write signal WLWT by shifting the write signal EWT by a write latency interval. For example, when the write latency interval is an interval of 34 periods of the internal clock signal ICLK, the latency shift circuit 261 may generate the latency write signal WLWT by shifting the write signal EWT by an interval of 34 periods of the internal clock signal ICLK. The configuration and operation of the latency shift circuit 261 will be described below with reference to FIG. 8.

The write flag signal output circuit 263 may sequentially generate the pre-write flag signal WTTF, the write flag signal WTT and the internal write flag signal IWTT by shifting the latency write signal WLWT in synchronization with the internal clock signal ICLK. The write flag signal output circuit 263 may generate the pre-write flag signal WTTF by shifting the latency write signal WLWT by an interval smaller than an interval corresponding to the first burst length. The write flag signal output circuit 263 may generate the write flag signal WTT by shifting the latency write signal WLWT by the interval corresponding to the first burst length. For example, the interval corresponding to the first burst length may be set to an interval including an interval of eight (16/2) periods of the clock signal CLK, when the first burst length is set to 16. The write flag signal output circuit 263 may generate the write flag signal WTT by shifting the latency write signal WLWT by an interval including eight periods of the internal clock signal ICLK, when the first burst length is set to 16. The write flag signal output circuit 263 may generate the pre-write flag signal WTTF by shifting the latency write signal WLWT by an interval shorter by an interval of two periods of the clock signal CLK than the point of time that the write flag signal WTT is generated.

The write flag signal output circuit 263 may generate the internal write flag signal IWTT by shifting the latency write signal WLWT by an interval corresponding to the second burst length. For example, the interval corresponding to the second burst length may be set to an interval including an interval of 16 (32/2) periods of the internal clock signal ICLK, when the second burst length is set to 32. Therefore, the write flag signal output circuit 263 may generate the internal write flag signal IWTT by shifting the latency write signal WLWT by an interval including 16 periods of the internal clock signal ICLK, when the second burst length is set to 32. The configuration and operation of the write flag signal output circuit 263 will be described with reference to FIG. 9.

Figure 8:
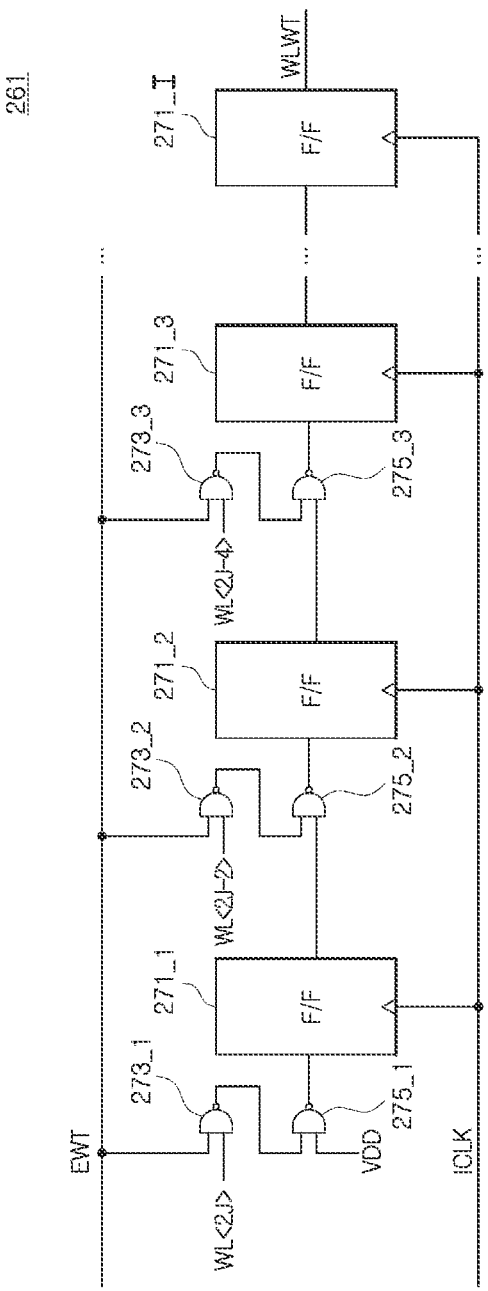
FIG. 8 is a circuit diagram illustrating an embodiment of a latency shift circuit included in the write flag generation circuit illustrated in FIG. 7.

FIG. 8 is a circuit diagram illustrating an embodiment of the latency shift circuit 261. As illustrated in FIG. 8, the latency shift circuit 261 may include a plurality of flip-flops 271_1 to 271_I and a plurality of NAND gates 273_1 to 273_J and 275_1 to 275_J. Here, 'I' may be set to a natural number equal to or more than 2, and 'J' may be set to a natural number equal to or less than 'I'.

The NAND gate 273_1 may receive a $J^{th}$ write latency signal WL<2J> and the write signal EWT, and perform a NAND operation on the received signals. The NAND gate 275_1 may receive an output signal of the NAND gate 273_1 and an external voltage VDD, and perform a NAND operation on the received signals. The external voltage VDD may be applied from a power pad (not illustrated). The flip-flop 2711 may delay an output signal of the NAND gate 2751 by an interval of two periods of the internal clock signal ICLK in synchronization with a rising edge of the internal clock signal ICLK.

The NAND gate 273_2 may receive a $(J-1)^{th}$ write latency signal WL<2J-2> and the write signal EWT, and perform a NAND operation on the received signals. The NAND gate 275_2 may receive an output signal of the NAND gate 273_2 and an output signal of the flip-flop 271_1, and perform a NAND operation on the received signals. The flip-flop 271_2 may delay an output signal of the NAND gate 275_2 by an interval of two periods of the internal clock signal ICLK in synchronization with a rising edge of the internal clock signal ICLK.

The NAND gate 273_3 may receive a $(J-2)^{th}$ write latency signal WL<2J-4> and the write signal EWT, and perform a NAND operation on the received signals. The NAND gate 275_3 may receive an output signal of the NAND gate 273_3 and an output signal of the flip-flop 271_2, and perform a NAND operation on the received signals. The flip-flop 271_3 may delay an output signal of the NAND gate 275_3 by an interval of two periods of the internal clock signal ICLK in synchronization with a rising edge of the internal clock signal ICLK.

The flip-flop 271_I may generate the latency write signal WLWT by delaying an output signal of the flip-flop 271_I-1 by an interval of two periods of the internal clock signal ICLK in synchronization with a rising edge of the internal clock signal ICLK.

Thus, the latency shift circuit 261 may generate the latency write signal WLWT by delaying the write signal EWT by an interval of 2J periods of the internal clock signal ICLK, when the $J^{th}$ write latency signal WL<2J> is enabled to a logic high level. The latency shift circuit 261 may generate the latency write signal WLWT by delaying the write signal EWT by an interval of (2J-2) periods of the internal clock signal ICLK, when the $(J-1)^{th}$ write latency signal WL<2J-2> is enabled to a logic high level.

Figure 9:
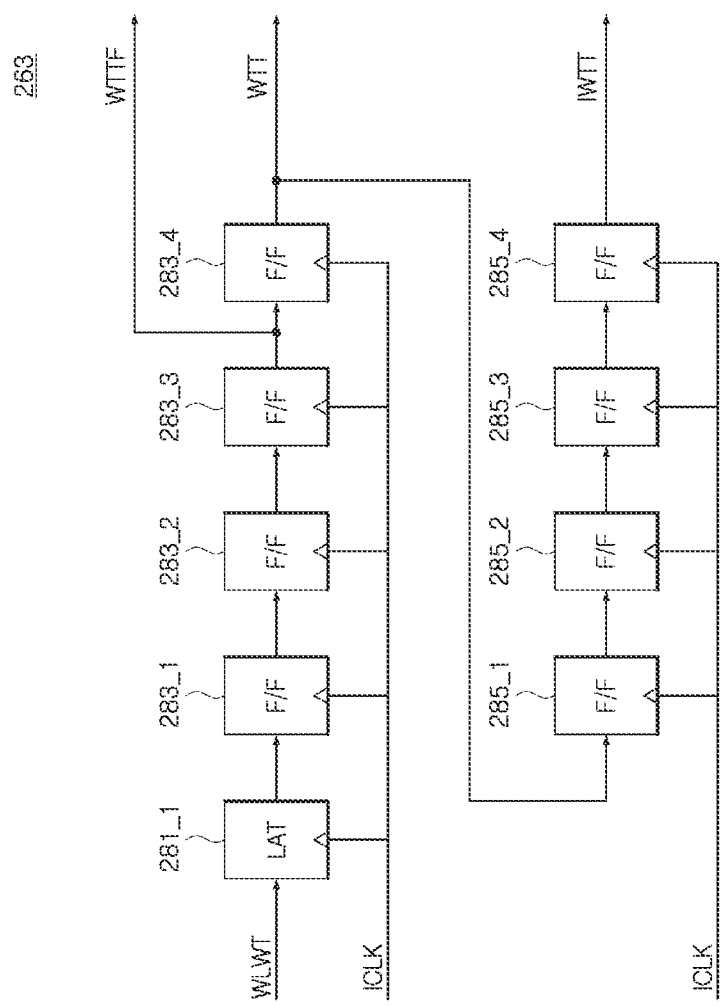
FIG. 9 is a circuit diagram illustrating an embodiment of a write flag signal output circuit included in the write flag generation circuit illustrated in FIG. 7.

FIG. 9 is a circuit diagram illustrating an embodiment of the write flag signal output circuit 263. As illustrated in FIG. 9, the write flag signal output circuit 263 may include a latch circuit 281_1 and a plurality of flip-flops 283_1 to 283_4 and 285_1 to 285_4.

The latch circuit 2811 may shift the latency write signal WLWT by an interval of one period of the internal clock signal ICLK in synchronization with a rising edge of the internal clock signal ICLK. The flip-flop 283_1 may shift an output signal of the latch circuit 281_1 by an interval of two periods of the internal clock signal ICLK in synchronization with a rising edge of the internal clock signal ICLK. The flip-flop 283_2 may shift an output signal of the flip-flop 283_1 by an interval of two periods of the internal clock signal ICLK in synchronization with a rising edge of the internal clock signal ICLK. The flip-flop 283_3 may shift an output signal of the flip-flop 283_2 by an interval of two periods of the internal clock signal ICLK in synchronization with a rising edge of the internal clock signal ICLK, and output the shifted signal as the pre-write flag signal WTTF. In the present embodiments, the pre-write flag signal WTTF may be generated by shifting the latency write signal WLWT by an interval of seven periods of the internal clock signal ICLK. The flip-flop 283_4 may shift the pre-write flag signal WTTF by an interval of two periods of the internal clock signal ICLK in synchronization with a rising edge of the internal clock signal ICLK, and output the shifted signal as the write flag signal WTT. In the present embodiments, the write flag signal WTT may be generated by shifting the latency write signal WLWT by an interval of nine periods of the internal clock signal ICLK.

The flip-flop 285_1 may shift the write flag signal WTT by an interval of two periods of the internal clock signal ICLK in synchronization with a rising edge of the internal clock signal ICLK. The flip-flop 285_2 may shift an output signal of the flip-flop 285_1 by an interval of two periods of the internal clock signal ICLK in synchronization with a rising edge of the internal clock signal ICLK. The flip-flop 285_3 may shift an output signal of the flip-flop 285_2 by an interval of two periods of the internal clock signal ICLK in synchronization with a rising edge of the internal clock signal ICLK. The flip-flop 285_4 may shift an output signal of the flip-flop 285_3 by an interval of two periods of the internal clock signal ICLK in synchronization with a rising edge of the internal clock signal ICLK, and output the shifted signal as the internal write flag signal IWTT. In the present embodiment, the internal write flag signal IWTT may be generated by shifting the write flag signal WTT by an interval of eight periods of the internal clock signal ICLK.

Figure 10:
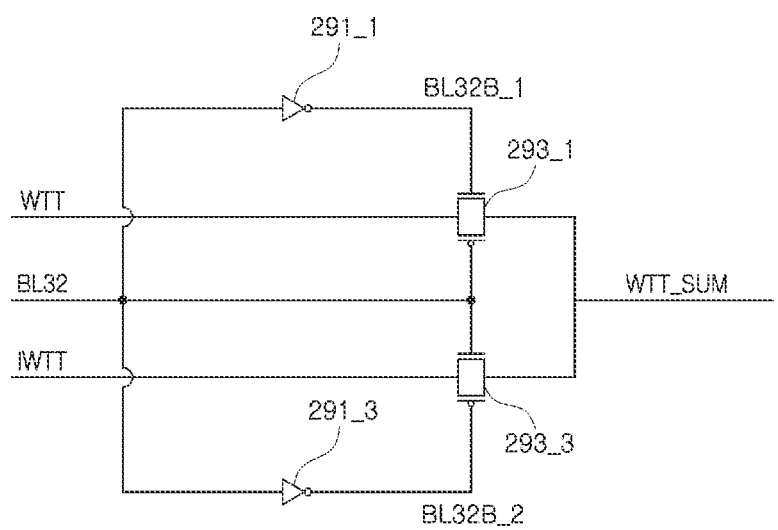
FIG. 10 is a circuit diagram illustrating an embodiment of a sum flag generation circuit included in the electronic device illustrated in FIG. 2.

FIG. 10 is a circuit diagram illustrating an embodiment of the sum flag generation circuit 209. As illustrated in FIG. 10, the sum flag generation circuit 209 may include inverters 291_1 and 291_3 and transfer gates 293_1 and 293_3.

The inverter 291_1 may generate a first inverted burst mode signal BL32B1 by inverting and buffering the burst mode signal BL32. The transfer gate 293_1 may output the write flag signal WTT as the sum write flag signal WTT_SUM when the burst mode signal BL32 is disabled to a logic low level and the first inverted burst mode signal BL32B1 is enabled to a logic high level.

The inverter 291_3 may generate a second inverted burst mode signal BL32B2 by inverting and buffering the burst mode signal BL32. The transfer gate 293_3 may output the internal write flag signal IWTT as the sum write flag signal WTT_SUM when the burst mode signal BL32 is enabled to a logic high level and the second inverted burst mode signal BL32B2 is disabled to a logic low level.

Figure 11:
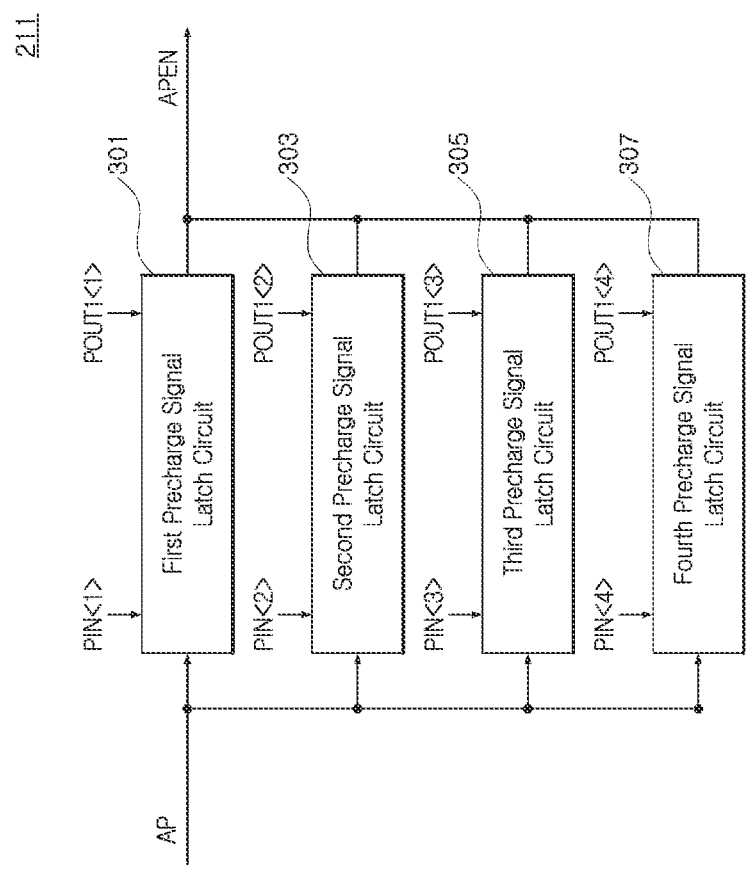
FIG. 11 is a block diagram illustrating an embodiment of a configuration of an embodiment of a precharge enable signal generation circuit included in the electronic device illustrated in FIG. 2.

FIG. 11 is a block diagram illustrating an embodiment of the precharge enable signal generation circuit 211. As illustrated in FIG. 11, the precharge enable signal generation circuit 211 may include a plurality of precharge signal latch circuits 301, 303, 305 and 307.

The first precharge signal latch circuit 301 may latch the auto-precharge signal AP based on the first bit PIN<1> of the input control signal, and output the latched auto-precharge signal AP as the precharge enable signal APEN based on the first bit POUT1<1> of the first output control signal. The second precharge signal latch circuit 303 may latch the auto-precharge signal AP based on the second bit is PIN<2> of the input control signal, and output the latched auto-precharge signal AP as the precharge enable signal APEN based on the second bit POUT1<2> of the first output control signal. The third precharge signal latch circuit 305 may latch the auto-precharge signal AP based on a third bit PIN<3> of the input control signal, and output the latched auto-precharge signal AP as the precharge enable signal APEN based on a third bit POUT1<3> of the first output control signal. The fourth precharge signal latch circuit 307 may latch the auto-precharge signal AP based on a fourth bit PIN<4> of the input control signal, and output the latched auto-precharge signal AP as the precharge enable signal APEN based on a fourth bit POUT1<4> of the first output control signal.

Figure 12:
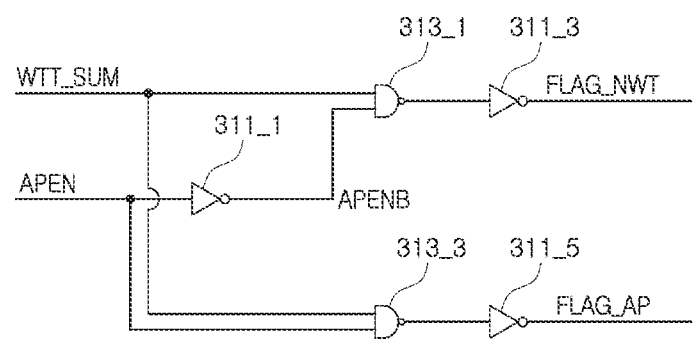
FIG. 12 is a circuit diagram illustrating an embodiment of an operation flag generation circuit included in the electronic device illustrated in FIG. 2.

FIG. 12 is a circuit diagram illustrating an embodiment of the operation flag generation circuit 213. As illustrated in FIG. 12, the operation flag generation circuit 213 may include inverters 311_1, 311_3 and 311_5 and NAND gates 313_1 and 313_3.

The inverter 311_1 may generate an inverted precharge enable signal APENB by inverting and buffering the precharge enable signal APEN. The precharge enable signal APEN may be disabled to a logic low level when a normal write operation is performed, and enabled to a logic high level when the write operation with the auto-precharge operation is performed. The inverted precharge enable signal APENB may be enabled to a logic high level when the normal write operation is performed, and disabled to a logic low level when the write operation with the auto-precharge operation is performed.

The NAND gate 313_1 may receive the sum write flag signal WTT_SUM and the inverted precharge enable signal APENB, and perform a NAND operation on the received signals. The inverter 311_3 may generate the normal write flag signal FLAG_NWT by inverting a buffering and output signal of the NAND gate 313_1. The NAND gate 3133 may receive the sum write flag signal WTT_SUM and the precharge enable signal APEN, and perform a NAND operation on the received signals. The inverter 311_5 may generate the precharge flag signal FLAG_AP by inverting and buffering an output signal of the NAND gate 313_3.

Figure 13:
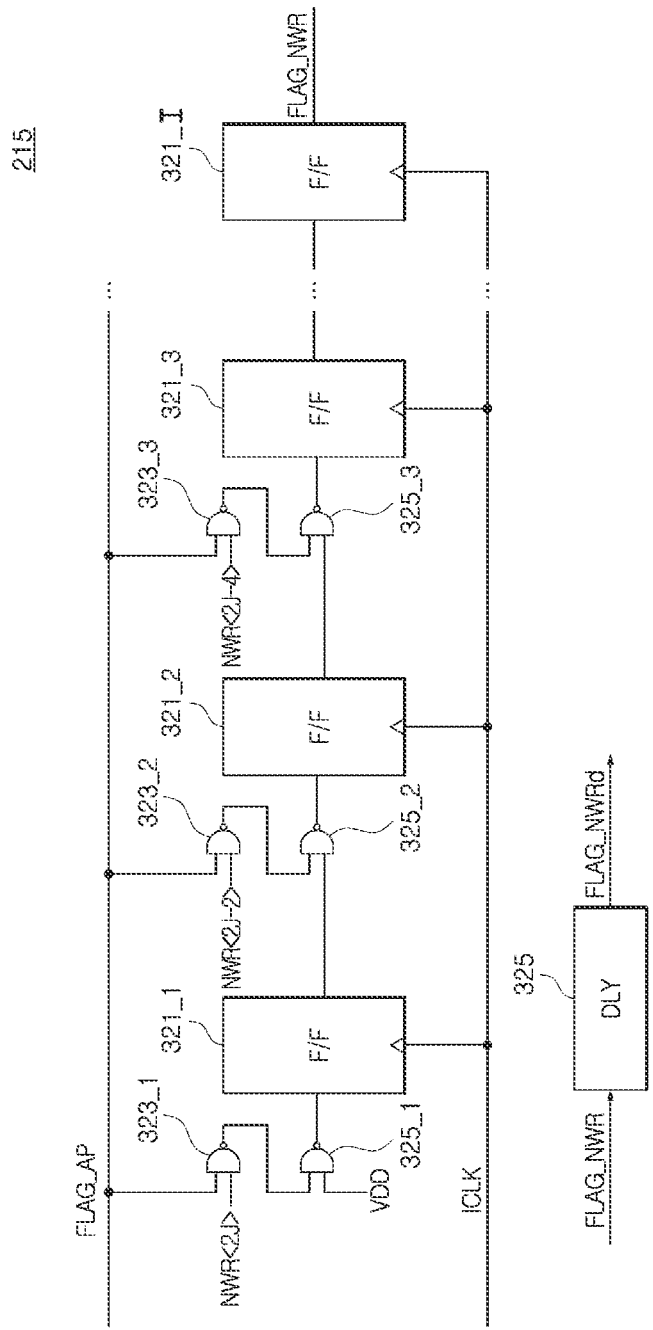
FIG. 13 is a diagram illustrating an embodiment of a write recovery shift circuit included in the electronic device illustrated in FIG. 2.

FIG. 13 is a diagram illustrating an embodiment of the write recovery shift circuit 215. As illustrated in FIG. 13, the write recovery shift circuit 215 may include a plurality of flip-flops 321_1 to 321_I, a plurality of NAND gates 323_1 to 323_J and 325_1 to 325_J and a delay circuit 325. Here, 'I' may be set to a natural number equal to or more than 2, and 'J' may be set to a natural number equal to or less than 'I'.

The NAND gate 323_1 may receive a $J^{th}$ write recovery signal NWR<2J> and the precharge flag signal FLAG_AP, and perform a NAND operation on the received signals. The NAND gate 325_1 may receive an output signal of the NAND gate 323_1 and the external voltage VDD, and perform a NAND operation on the received signals. The external voltage VDD may be applied from the power pad (not illustrated). The flip-flop 321_1 may delay an output signal of the NAND gate 325_1 by an interval of two periods of the internal clock signal ICLK in synchronization with a rising edge of the internal clock signal ICLK.

The NAND gate 323_2 may receive a $(J-1)^{th}$ write recovery signal NWR<2J-2> and the precharge flag signal FLAG_AP, and perform a NAND operation on the received signals. The NAND gate 325_2 may receive an output signal of the NAND gate 323_2 and an output signal of the flip-flop 321_1, and perform a NAND operation on the received signals. The flip-flop 321_2 may delay an output signal of the NAND gate 325_2 by an interval of two periods of the internal clock signal ICLK in synchronization with a rising edge of the internal clock signal ICLK.

The NAND gate 323_3 may receive a $(J-2)^{th}$ write recovery signal NWR<2J-4> and the precharge flag signal FLAG_AP, and perform a NAND operation on the received signals. The NAND gate 325_3 may receive an output signal of the NAND gate 323_3 and an output signal of the flip-flop 321_2, and perform a NAND operation on the received signals. The flip-flop 321_3 may delay an output signal of the NAND gate 325_3 by an interval of two periods of the internal clock signal ICLK in synchronization with a rising edge of the internal clock signal ICLK.

The flip-flop 321_I may generate the recovery flag signal FLAG_NWR by delaying an output signal of the flip-flop 321_I–1 by an interval of two periods of the internal clock signal ICLK in synchronization with a rising edge of the internal clock signal ICLK.

The delay circuit 325 may generate the delayed recovery flag signal FLAG_NWRd by delaying the recovery flag signal FLAG_NWR by a preset interval.

Thus, the write recovery shift circuit 215 may generate the recovery flag signal FLAG_NWR by delaying the precharge flag signal FLAG_AP by an interval of 2J periods of the internal clock signal ICLK, when the $J^{th}$ write recovery signal NWR<2J> is enabled to a logic high level. The write recovery shift circuit 215 may generate the recovery flag signal FLAG_NWR by delaying the precharge flag signal FLAG_AP by an interval of (2J–2) periods of the internal clock signal ICLK, when the $(J-1)^{th}$ write recovery signal NWR<2J–2> is enabled to a logic high level.

Figure 14:
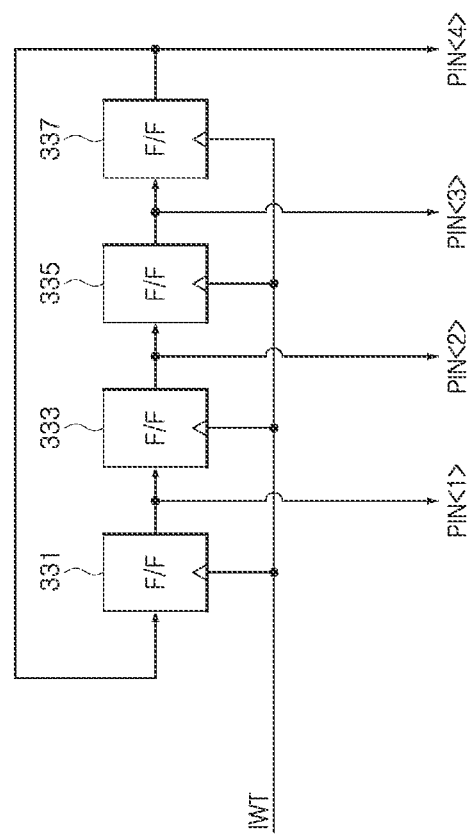
FIG. 14 is a circuit diagram illustrating an embodiment of an input control signal generation circuit included in the electronic device illustrated in FIG. 2.

FIG. 14 is a circuit diagram illustrating an embodiment of the input control signal generation circuit 219. As illustrated in FIG. 14, the input control signal generation circuit 219 may include a plurality of flip-flops 331, 333, 335 and 337. The input control signal generation circuit 219 may generate the input control signal PIN by counting the number of times that the internal write signal IWT transitions from a logic low level to a logic high level.

The flip-flop 331 may latch the fourth bit PIN<4> of the input control signal, which is enabled to a logic high level when the internal write signal IWT transitions from a logic low level to a logic high level, and enable the first bit PIN<1> of the input control signal to a logic high level. The flip-flop 333 may latch the first bit PIN<1> of the input control signal, which is enabled to a logic high level when the internal write signal IWT transitions from a logic low level to a logic high level, and enable the second bit PIN<2> of the input control signal to a logic high level. The flip-flop 335 may latch the second bit PIN<2> of the input control signal, which is enabled to a logic high level when the internal write signal IWT transitions from a logic low level to a logic high level, and enable the third bit PIN<3> of the input control signal to a logic high level. The flip-flop 337 may latch the third bit PIN<3> of the input control signal, which is enabled to a logic high level when the internal write signal IWT transitions from a logic low level to a logic high level, and enable the fourth bit PIN<4> of the input control signal to a logic high level.

The logic level combination of the input control signal PIN may be set to various combinations during an initialization operation according to an embodiment. For example, the first to fourth bits PIN<1:4> of the input control signal may be set to 'L, L, L, H' during the initialization operation. Thus, the input control signal generation circuit 219 may enable the first bit PIN<1> of the input control signal to a logic high level when the internal write signal IWT is input for the first time, and enable the second bit PIN<2> of the input control signal to a logic high level when the internal write signal IWT is input for the second time.

Figure 15:
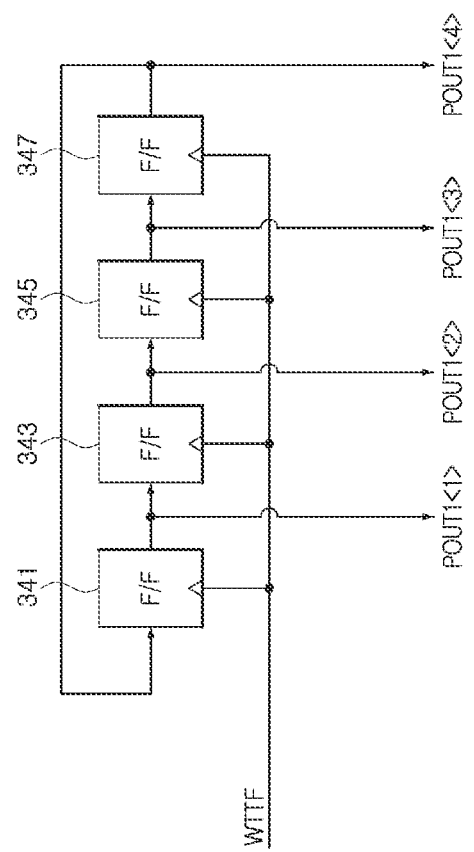
FIG. 15 is a circuit diagram illustrating an embodiment of a first output control signal generation circuit included in the electronic device illustrated in FIG. 2.

FIG. 15 is a circuit diagram illustrating an embodiment of the first output control signal generation circuit 221. As illustrated in FIG. 15, the first output control signal generation circuit 221 may include a plurality of flip-flops 341, 343, 345 and 347. The first output control signal generation circuit 221 may generate the first output control signal POUT1 by counting the number of times that the pre-write flag signal WTTF transitions from a logic low level to a logic high level.

The flip-flop 341 may latch the fourth bit POUT1<4> of the first output control signal, which is enabled to a logic high level when the pre-write flag signal WTTF transitions from a logic low level to a logic high level, and enable the first bit POUT1<1> of the first output control signal to a logic high level. The flip-flop 343 may latch the first bit POUT1<1> of the first output control signal, which is enabled to a logic high level when the pre-write flag signal WTTF transitions from a logic low level to a logic high level, and enable the second bit POUT1<2> of the first output control signal to a logic high level. The flip-flop 345 may latch the second bit POUT1<2> of the first output control signal, which is enabled to a logic high level when the pre-write flag signal WTTF transitions from a logic low level to a logic high level, and enable the third bit POUT1<3> of the first output control signal to a logic high level. The flip-flop 347 may latch the third bit POUT1<3> of the first output control signal, which is enabled to a logic high level when the pre-write flag signal WTTF transitions from a logic low level to a logic high level, and enable the fourth bit POUT1<4> of the first output control signal to a logic high level.

The logic level combination of the first output control signal POUT1 may be set to various combinations during the initialization operation according to an embodiment. For example, the first to fourth bits POUT<1:4> of the first output control signal may be set to 'L, L, L, H' during the initialization operation. Thus, the first output control signal generation circuit 221 may enable the first bit POUT1<1> of the first output control signal to a logic high level when the pre-write flag signal WTTF is input for the first time, and enable the second bit POUT1<2> of the first output control signal to a logic high level when the pre-write flag signal WTTF is input for the second time.

Figure 16:
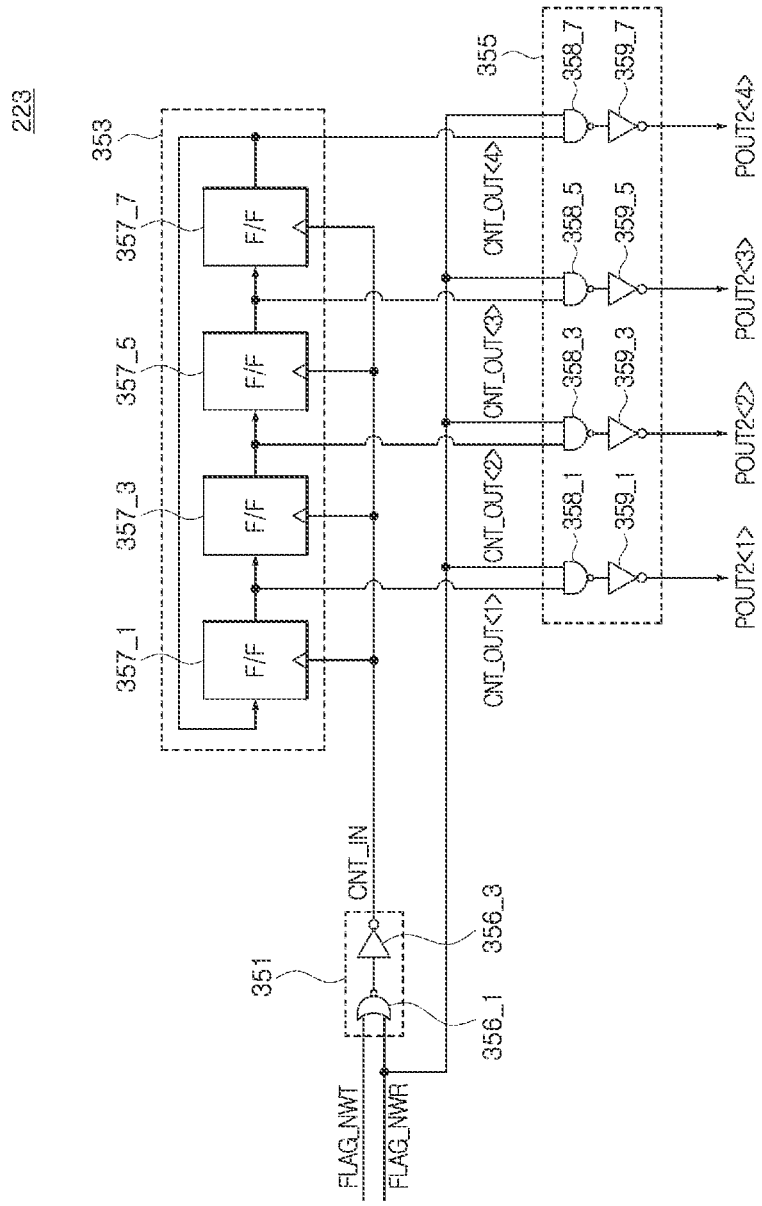
FIG. 16 is a circuit diagram illustrating an embodiment of a second output control signal generation circuit included in the electronic device illustrated in FIG. 2.

FIG. 16 is a circuit diagram illustrating an embodiment of the second output control signal generation circuit 223. As illustrated in FIG. 16, the second output control signal generation circuit 223 may include a signal summing circuit 351, a count circuit 353 and an output control circuit 355. The second output control signal generation circuit 223 may generate the second output control signal POUT2 by counting the number of times that one of the normal write flag signal FLAG_NWT and the recovery flag signal FLAG_NWR transitions from a logic low level to a logic high level.

The signal summing circuit 351 may generate a sum count input signal CNT_IN by summing the normal write flag signal FLAG_NWT and the recovery flag signal FLAG_NWR. The signal summing circuit 351 may generate the sum count input signal CNT_IN which is enabled to a logic high level when one of the normal write flag signal FLAG_NWT and the recovery flag signal FLAG_NWR is enabled to a logic high level.

The signal summing circuit 351 may include a NOR gate 356_1 and an inverter 356_3. The NOR gate 356_1 may receive the normal write flag signal FLAG_NWT and the recovery flag signal FLAG_NWR, and perform a NOR operation on the received signals. The inverter 356_3 may generate the sum count input signal CNT_IN by inverting and buffering an output signal of the NOR gate 356_1.

The count circuit 353 may include flip-flops 357_1, 3573, 357_5 and 357_7. The count circuit 353 may generate a count output signal CNT_OUT by counting the number of times that the sum count input signal CNT_IN is input.

The flip-flop 357_1 may latch a fourth bit CNT_OUT<4> of the count output signal, which is enabled to a logic high level when the sum count input signal CNT_IN transitions from a logic low level to a logic high level, and enable the first bit CNT_OUT<1> of the count output signal to a logic high level. The flip-flop 3573 may latch the first bit CNT_OUT<1> of the count output signal, which is enabled to a logic high level when the sum count input signal CNT_IN transitions from a logic low level to a logic high level, and enable the second bit CNT_OUT<2> of the count output signal to a logic high level. The flip-flop 357_5 may latch the second bit CNT_OUT<2> of the count output signal, which is enabled to a logic high level when the sum count input signal CNT_IN transitions from a logic low level to a logic high level, and enable a third bit CNT_OUT<3> of the count output signal to a logic high level. The flip-flop 357_7 may latch the third bit CNT_OUT<3> of the count output signal, which is enabled to a logic high level when the sum count input signal CNT_IN transitions from a logic low level to a logic high level, and enable the fourth bit CNT_OUT<4> of the count output signal to a logic high level.

The logic level combination of the count output signal CNT_OUT may be set to various combinations during an initialization operation according to an embodiment. For example, the first to fourth bits CNT_OUT<1:4> of the count output signal may be set to 'L, L, L, H' during the initialization operation. Thus, the count circuit 353 may enable the first bit CNT_OUT<1> of the count output signal to a logic high level when the sum count input signal CNT_IN is input for the first time, and enable the second bit CNT_OUT<2> of the count output signal to a logic high level when the sum count input signal CNT_IN is input for the second time.

The output control circuit 355 may output the count output signal CNT_OUT as the second output control signal POUT2 when the write operation with the auto-precharge operation is performed based on the recovery flag signal FLAG_NWR. The output control circuit 355 may output the count output signal CNT_OUT as the second output control signal POUT2 when the recovery flag signal FLAG_NWR is enabled to a logic high level.

The output control circuit 355 may include NAND gates 358_1, 3583, 358_5 and 358_7 and inverters 359_1, 359_3, 359_5 and 359_7. The NAND gate 358_1 may receive the first bit CNT_OUT<1> of the count output signal and the recovery flag signal FLAG_NWR, and perform a NAND operation on the received signals. The inverter 359_1 may generate the first bit POUT2<1> of the second output control signal by inverting and buffering an output signal of the NAND gate 358_1. The NAND gate 358_3 may receive the second bit CNT_OUT<2> of the count output signal and the recovery flag signal FLAG_NWR, and perform a NAND operation on the received signals. The inverter 359_3 may generate the second bit POUT2<2> of the second output control signal by inverting and buffering an output signal of the NAND gate 358_3. The NAND gate 358_5 may receive the third bit CNT_OUT<3> of the count output signal and the recovery flag signal FLAG_NWR, and perform a NAND operation on the received signals. The inverter 359_5 may generate a third bit POUT2<3> of the second output control signal by inverting to and buffering an output signal of the NAND gate 358_5. The NAND gate 358_7 may receive the fourth bit CNT_OUT<4> of the count output signal and the recovery flag signal FLAG_NWR, and perform a NAND operation on the received signals. The inverter 359_7 may generate a fourth bit POUT2<4> of the second output control signal by inverting and buffering an output signal of the NAND gate 358_7.

Figure 17:
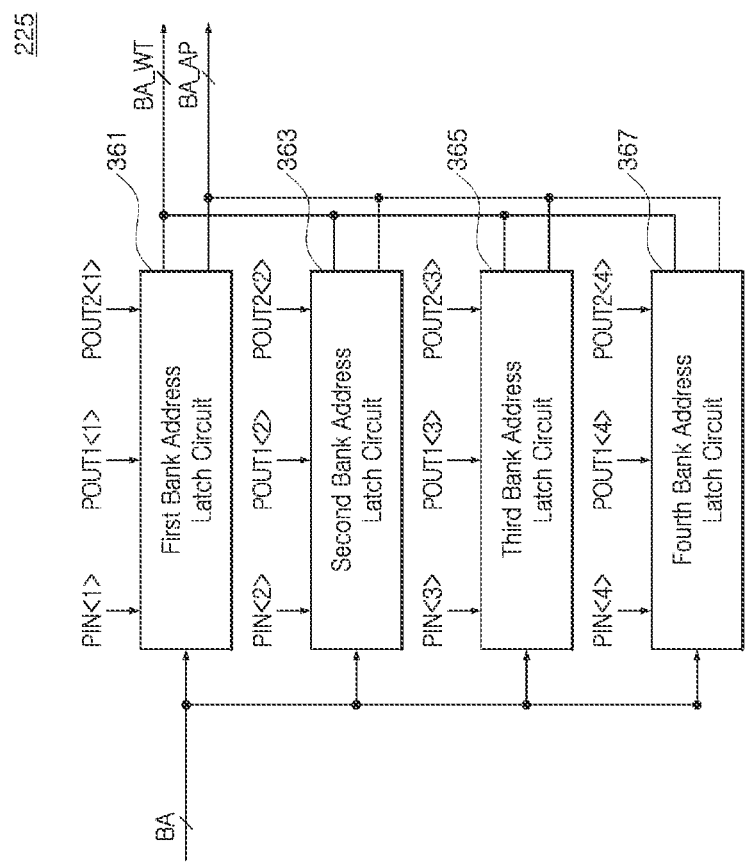
FIG. 17 is a block diagram illustrating a configuration of an embodiment of a bank address output circuit included in the electronic device illustrated in FIG. 2.

FIG. 17 is a circuit diagram illustrating an embodiment of the bank address output circuit 225. As illustrated in FIG. 17, the bank address output circuit 225 may include a plurality of bank address latch circuits 361, 363, 365 and 367.

The first bank address latch circuit 361 may latch the bank address BA based on the first bit PIN<1> of the input control signal. The first bank address latch circuit 361 may output the latched bank address BA as the write bank address BA_WT based on the first bit POUT1<1> of the first output control signal, and output the latched bank address BA as the precharge bank address BA_AP based on the first bit POUT2<1> of the second output control signal. The configuration and operation of the first bank address latch circuit 361 will be described below with reference to FIG. 18.

The second bank address latch circuit 363 may latch the bank address BA based on the second bit PIN<2> of the input control signal. The second bank address latch circuit 363 may output the latched bank address BA as the write bank address BA_WT based on the second bit POUT1<2> of the first output control signal, and output the latched bank address BA as the precharge bank address BA_AP based on the second bit POUT2<2> of the second output control signal.

The third bank address latch circuit 365 may latch the bank address BA based on the third bit PIN<3> of the input control signal. The third bank address latch circuit 365 may output the latched bank address BA as the write bank address BA_WT based on the third bit POUT1<3> of the first output control signal, and output the latched bank address BA as the precharge bank address BA_AP based on the third bit POUT2<3> of the second output control signal.

The fourth bank address latch circuit 367 may latch the bank address BA based on the fourth bit PIN<4> of the input control signal. The fourth bank address latch circuit 367 may output the latched bank address BA as the write bank address BA_WT based on the fourth bit POUT1<4> of the first output control signal, and output the latched bank address BA as the precharge bank address BA_AP based on the fourth bit POUT2<4> of the second output control signal.

Figure 18:
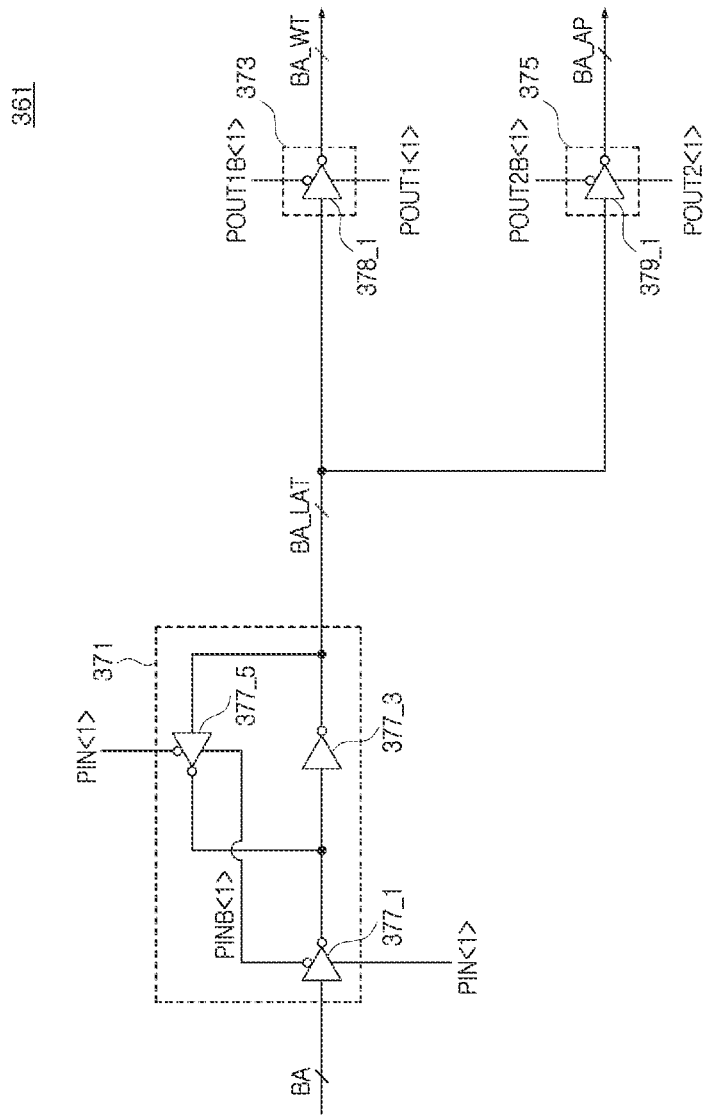
FIG. 18 is a circuit diagram illustrating an embodiment of a first bank address latch circuit included in the bank address output circuit illustrated in FIG. 17.

FIG. 18 is a circuit diagram illustrating an embodiment of the first bank address latch circuit 361. As illustrated in FIG. 18, the first bank address latch circuit 361 may include a bank address input circuit 371, a write bank address output circuit 373 and a precharge bank address output circuit 375.

The bank address input circuit 371 may latch the bank address BA based on the first bit PIN<1> of the input control signal, and output the latched bank address BA as a latch bank address BA_LAT. The bank address input circuit 371 may include inverters 377_1, 377_3 and 377_5. The inverter 377_1 may invert and buffer the address BA when the first bit PIN<1> of the input control signal is enabled to a logic high level. The inverter 377_1 may be enabled when the first bit PIN<1> of the input control signal is enabled to a logic high level and a first inverted bit PINB<1> of the input control signal is disabled to a logic low level. The first inverted bit PINB<1> of the input control signal may be generated by inverting the logic level of the first bit PIN<1> of the input control signal. The inverter 377_3 may generate the latch bank address BA_LAT by inverting and buffering an output signal of the inverter 377_1. The inverter 377_5 may invert and buffer an output signal of the inverter 377_3 when the first bit PIN<1> of the input control signal is disabled to a logic low level, and feed the inverted and buffered signal back to an input terminal of the inverter 377_3. The inverter 377_5 may be enabled when the first bit PIN<1> of the input control signal is disabled to a logic low level and the first inverted bit PINB<1> of the input control signal is enabled to a logic high level.

The write bank address output circuit 373 may output the latch bank address BA_LAT as the write bank address BA_WT based on the first bit POUT1<1> of the first output control signal. The write bank address output circuit 373 may include an inverter 378_1. The inverter 378_1 may generate the write bank address BA_WT by inverting and buffering the latch bank address BA_LAT when the first bit POUT1<1> of the first output control signal is enabled to a logic high level. The inverter 378_1 may be enabled when the first bit POUT1<1> of the first output control signal is enabled to a logic high level and a first inverted bit POUT1B<1> of the first output control signal is disabled to a logic low level. The first inverted bit POUT1B<1> of the first output control signal may be generated by inverting the logic level of the first bit POUT1<1> of the first output control signal.

The precharge bank address output circuit 375 may output the latch bank address BA_LAT as the precharge bank address BA_AP based on the first bit POUT2<1> of the second output control signal. The precharge bank address output circuit 375 may include an inverter 379_1. The inverter 379_1 may generate the precharge bank address BA_AP by inverting and buffering the latch bank address BA_LAT when the first bit POUT2<1> of the second output control signal is enabled to a logic high level. The inverter 379_1 may be enabled when the first bit POUT2<1> of the second output control signal is enabled to a logic high level and the first inverted bit POUT2B<1> of the second output control signal is disabled to a logic low level. The first inverted bit POUT2B<1> of the second output control signal may be generated by inverting the logic level of the first bit POUT2<1> of the second output control signal.

Figure 19:
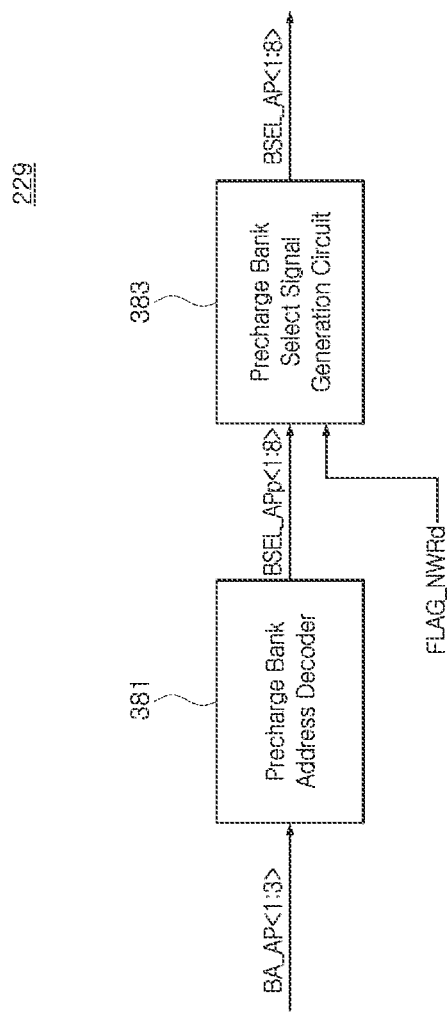
FIG. 19 is a block diagram illustrating a configuration of an embodiment of a precharge control circuit included in the electronic device illustrated in FIG. 2.

FIG. 19 is a block diagram illustrating an embodiment of the precharge control circuit 229. As illustrated in FIG. 19, the precharge control circuit 229 may include a precharge bank address decoder 381 and a precharge bank select signal generation circuit 383.

The precharge bank address decoder 381 may generate a pre-precharge bank select signal BSEL_APp by decoding the precharge bank address BA_AP. The precharge bank address decoder 381 may generate first to eighth pre-precharge bank select signals BSEL_APp<1:8> by decoding the first to third precharge bank addresses BA_AP<1:3>.

The precharge bank select signal generation circuit 383 may generate the precharge bank select signal BSEL_AP based on the pre-precharge bank select signal BSEL_APp and the delay recovery flag signal FLAG_NWRd. The precharge bank select signal generation circuit 383 may output the pre-precharge bank select signal BSEL_APp as the precharge bank select signal BSEL_AP when the delay recovery flag signal FLAG_NWRd is enabled. The configuration and operation of the precharge bank select signal generation circuit 383 will be described below with reference to FIG. 20.

Figure 20:
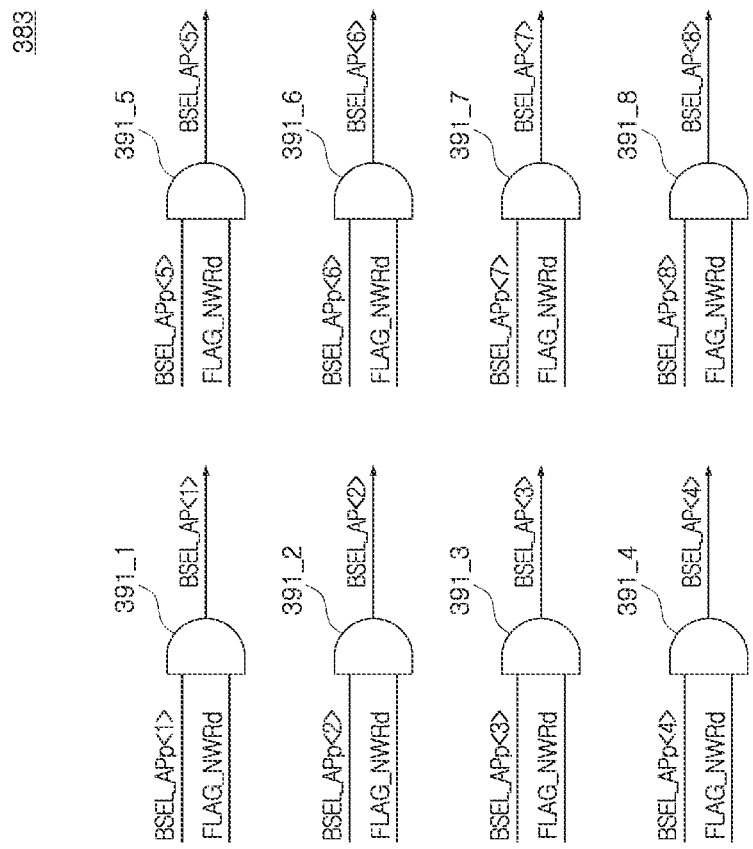
FIG. 20 is a circuit diagram illustrating an embodiment of a precharge bank select signal generation circuit included in the precharge control circuit illustrated in FIG. 19.

FIG. 20 is a circuit diagram illustrating an embodiment of the precharge bank select signal generation circuit 383. As illustrated in FIG. 20, the precharge bank select signal generation circuit 383 may include a plurality of AND gates 391_1 to 391_8.

The AND gate 391_1 may receive the delay recovery flag signal FLAG_NWRd and the first pre-precharge bank select signal BSEL_APp<1>, and generate a first precharge bank select signal BSEL_AP<1> by performing an AND operation on the received signals. The AND gate 391_2 may receive the delay recovery flag signal FLAG_NWRd and the second pre-precharge bank select signal BSEL_APp<2>, and generate a second precharge bank select signal BSEL_AP<2> by performing an AND operation on the received signals. The AND gate 391_3 may receive the delay recovery flag signal FLAG_NWRd and the third pre-precharge bank select signal BSEL_APp<3>, and generate a third precharge bank select signal BSEL_AP<3> by performing an AND operation on the received signals. The AND gate 391_4 may receive the delay recovery flag signal FLAG_NWRd and the fourth pre-precharge bank select signal BSEL_APp<4>, and generate a fourth precharge bank select signal BSEL_AP<4> by performing an AND operation on the received signals. The AND gate 391_5 may receive the delay recovery flag signal FLAG_NWRd and a fifth pre-precharge bank select signal BSEL_APp<5>, and generate the fifth precharge bank select signal BSEL_AP<5> by performing an AND operation on the received signals. The AND gate 391_6 may receive the delay recovery flag signal FLAG_NWRd and a sixth pre-precharge bank select signal BSEL_APp<6>, and generate the sixth precharge bank select signal BSEL_AP<6> by performing an AND operation on the received signals. The AND gate 391_7 may receive the delay recovery flag signal FLAG_NWRd and the seventh pre-precharge bank select signal BSEL_APp<7>, and generate a seventh precharge bank select signal BSEL_AP<7> by performing an AND operation on the received signals. The AND gate 391_8 may receive the delay recovery flag signal FLAG_NWRd and an eighth pre-precharge bank select signal BSEL_APp<8>, and generate the eighth precharge bank select signal BSEL_AP<8> by performing an AND operation on the received signals.

Figure 21:
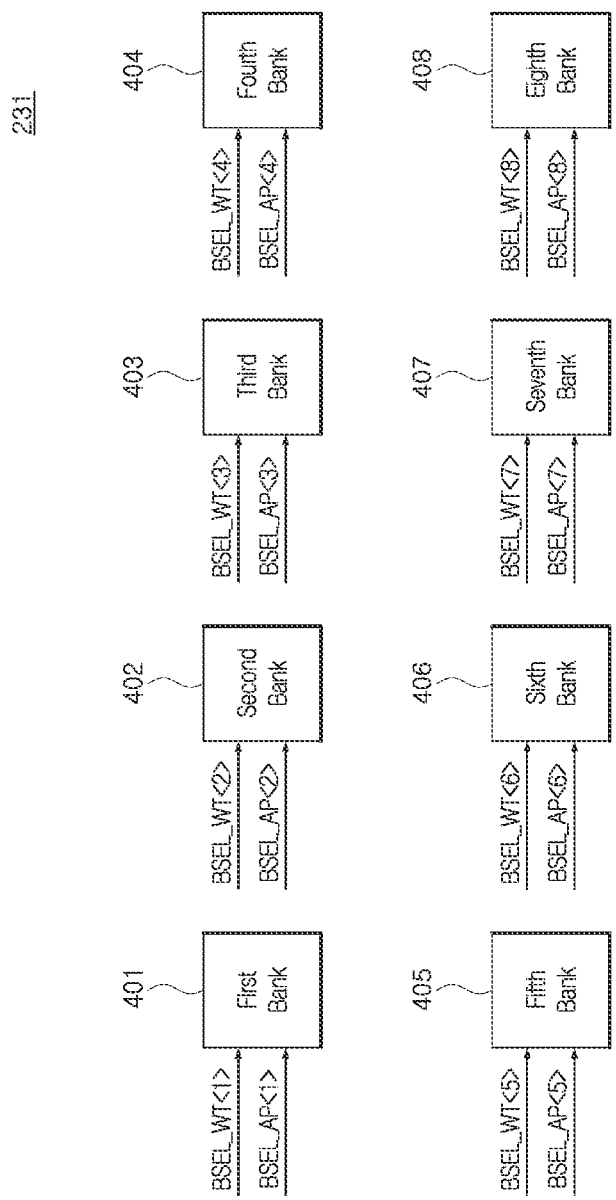
FIG. 21 is a block diagram illustrating a configuration of an embodiment of a core circuit included in the electronic device illustrated in FIG. 2.

FIG. 21 is a block diagram illustrating an embodiment of the core circuit 231. As illustrated in FIG. 21, the core circuit 231 may include a plurality of banks 401 to 408.

The first bank 401 may perform the write operation when a first write bank select signal BSEL_WT<1> is enabled, and perform the auto-precharge operation when the first precharge bank select signal BSEL_AP<1> is enabled. The second bank 402 may perform the write operation when a second write bank select signal BSEL_WT<2> is enabled, and perform the auto-precharge operation when the second precharge bank select signal BSEL_AP<2> is enabled. The third bank 403 may perform the write operation when a third write bank select signal BSEL_WT<3> is enabled, and perform the auto-precharge operation when the third precharge bank select signal BSEL_AP<3> is enabled. The fourth bank 404 may perform the write operation when a fourth write bank select signal BSEL_WT<4> is enabled, and perform the auto-precharge operation when the fourth precharge bank select signal BSEL_AP<4> is enabled. The fifth bank 405 may perform the write operation when a fifth write bank select signal BSEL_WT<5> is enabled, and perform the auto-precharge operation when the fifth precharge bank select signal BSEL_AP<5> is enabled. The sixth bank 406 may perform the write operation when a sixth write bank select signal BSEL_WT<6> is enabled, and perform the auto-precharge operation when the sixth precharge bank select signal BSEL_AP<6> is enabled. The seventh bank 407 may perform the write operation when a seventh write bank select signal BSEL_WT<7> is enabled, and perform the auto-precharge operation when the seventh precharge bank select signal BSEL_AP<7> is enabled. The eighth bank 408 may perform the write operation when an eighth write bank select signal BSEL_WT<8> is enabled, and perform the auto-precharge operation when the eighth precharge bank select signal BSEL_AP<8> is enabled.

Referring to FIGS. 22 to 25, the write operation and the auto-precharge operation which are performed in the electronic device 120 illustrated in FIG. 2 will be described as follows.

Figure 22:
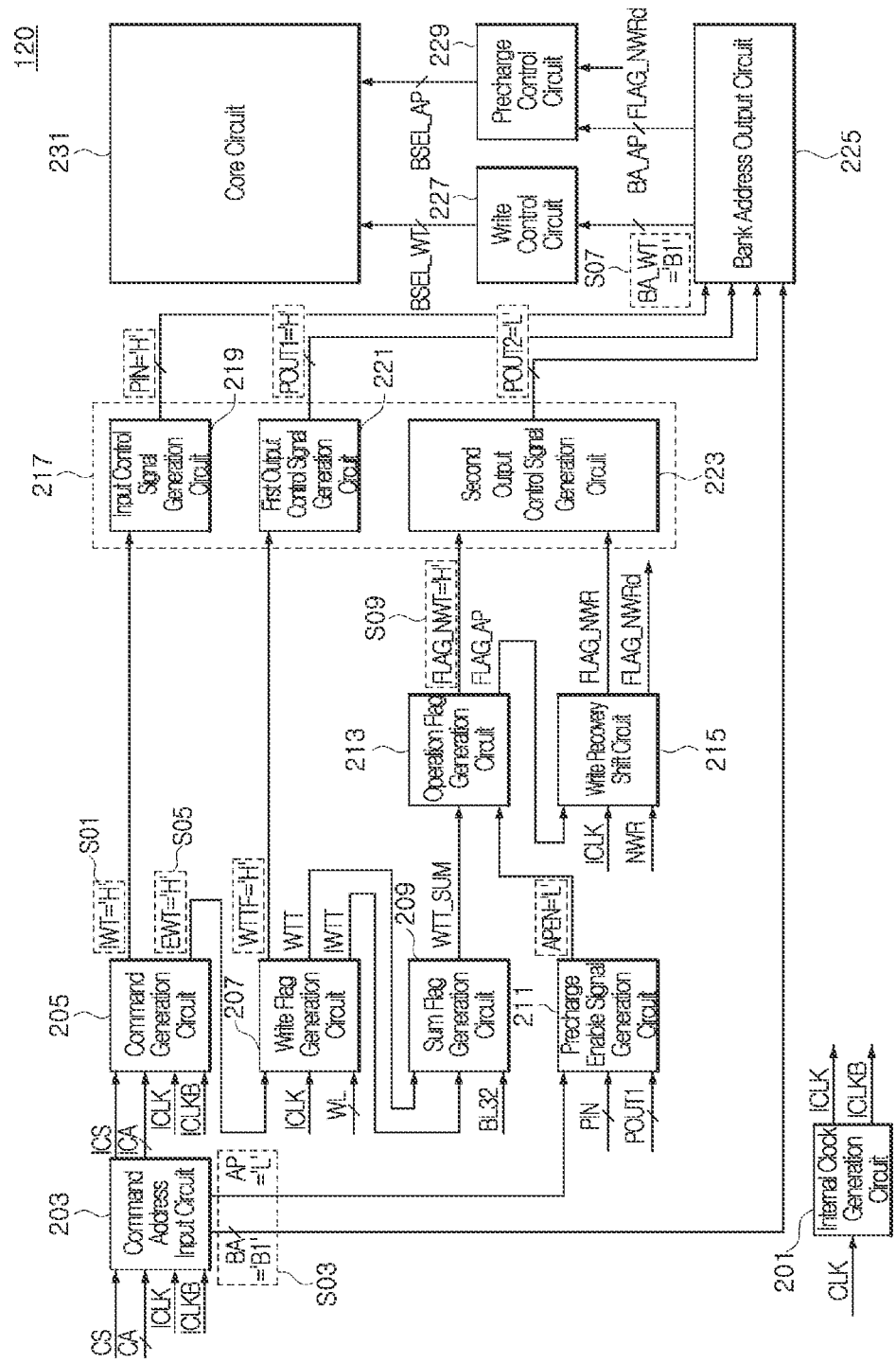
FIGS. 22, 23, 24, and 25 are diagrams for describing a write operation and an auto-precharge operation which are performed in the electronic device illustrated in FIG. 2.
Figure 23:
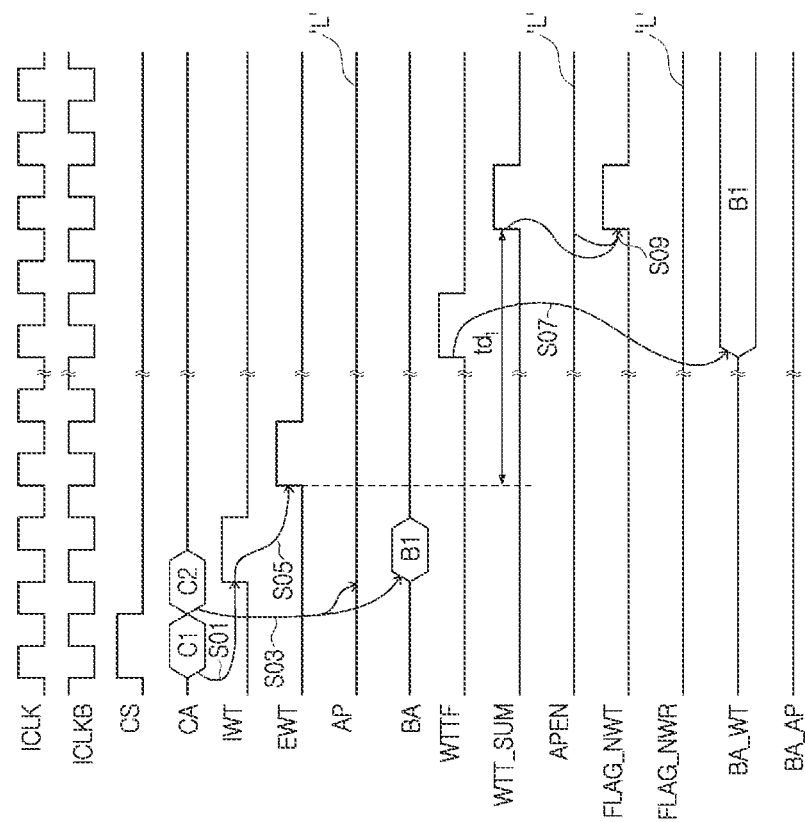

FIGS. 22 and 23 are diagrams for describing the operation of the electronic device 120 when the normal write operation is performed. As illustrated in FIGS. 22 and 23, the internal clock generation circuit 201 receives the clock signal CLK, and generates the internal clock signal ICLK and the inverted internal clock signal ICLKB. The command address input circuit 203 generates the internal chip select signal ICS from the chip select signal CS in synchronization with the internal clock signal ICLK, and generates the internal command address ICA from the command address CA having a logic level combination 'C1' for performing the write operation in synchronization with the internal clock signal ICLK. The command generation circuit 205 generates the write initialization signal (WT_INIT of FIG. 6) by decoding the internal chip select signal ICS and the internal command address ICA, and generates the internal write signal IWT by enabling the write initialization signal (WT_INIT of FIG. 6) to a logic high level 'H' in synchronization with the inverted internal clock signal ICLKB, in step S01. The command address input circuit 203 generates the bank address BA having a logic level combination 'B1' and the auto-precharge signal AP disabled to a logic low level 'L' from the command address CA having a logic level combination 'C2' in synchronization with the inverted internal clock signal ICLKB, in step S03. The input control signal generation circuit 219 generates the input control signal PIN enabled to a logic high level 'H', when the internal write signal IWT is enabled. The precharge enable signal generation circuit 211 latches the auto-precharge signal AP disabled in response to the enabled input control signal PIN. The bank address output circuit 225 latches the bank address BA having a logic level combination 'B1' in response to the enabled input control signal PIN.

The command generation circuit 205 generates the write signal EWT enabled to a logic high level 'H', based on the internal write signal IWT in synchronization with the internal clock signal ICLK. The write flag generation circuit 207 generates the pre-write flag signal WTTF enabled to a logic high level 'H', by shifting the write signal EWT by an interval shorter by an interval of two periods of the internal clock signal ICLK than an interval td1 obtained by adding the write latency interval and an interval corresponding to the first burst length, in synchronization with the internal clock signal ICLK. The first output control signal generation circuit 221 generates the first output control signal POUT1 enabled to a logic high level 'H', when the pre-write flag signal WTTF is enabled. The precharge enable signal generation circuit 211 outputs the precharge enable signal APEN disabled to a logic low level 'L' in response to the enabled first output control signal POUT1. The bank address output circuit 225 outputs the latched bank address BA as the write bank address BA_WT having a logic level combination 'B1' in response to the enabled first output control signal POUT1, in step S07.

The write flag generation circuit 207 generates the write flag signal WTT by shifting the write signal EWT by the interval td1 obtained by adding the write latency interval and the interval corresponding to the first burst length, in synchronization with the internal clock signal ICLK. The sum flag generation circuit 209 outputs the write flag signal WTT as the sum write flag signal WTT_SUM when the burst length is the first burst length. The operation flag generation circuit 213 generates the normal write flag signal FLAG_NWT enabled to a logic high level 'H' from the sum write flag signal WTT_SUM in response to the disabled precharge enable signal APEN, in step S09. The second output control signal generation circuit 223 generates the second output control signal POUT2 disabled to a logic low level 'L' in response to the enabled normal write flag signal FLAG_NWT.

Figure 24:
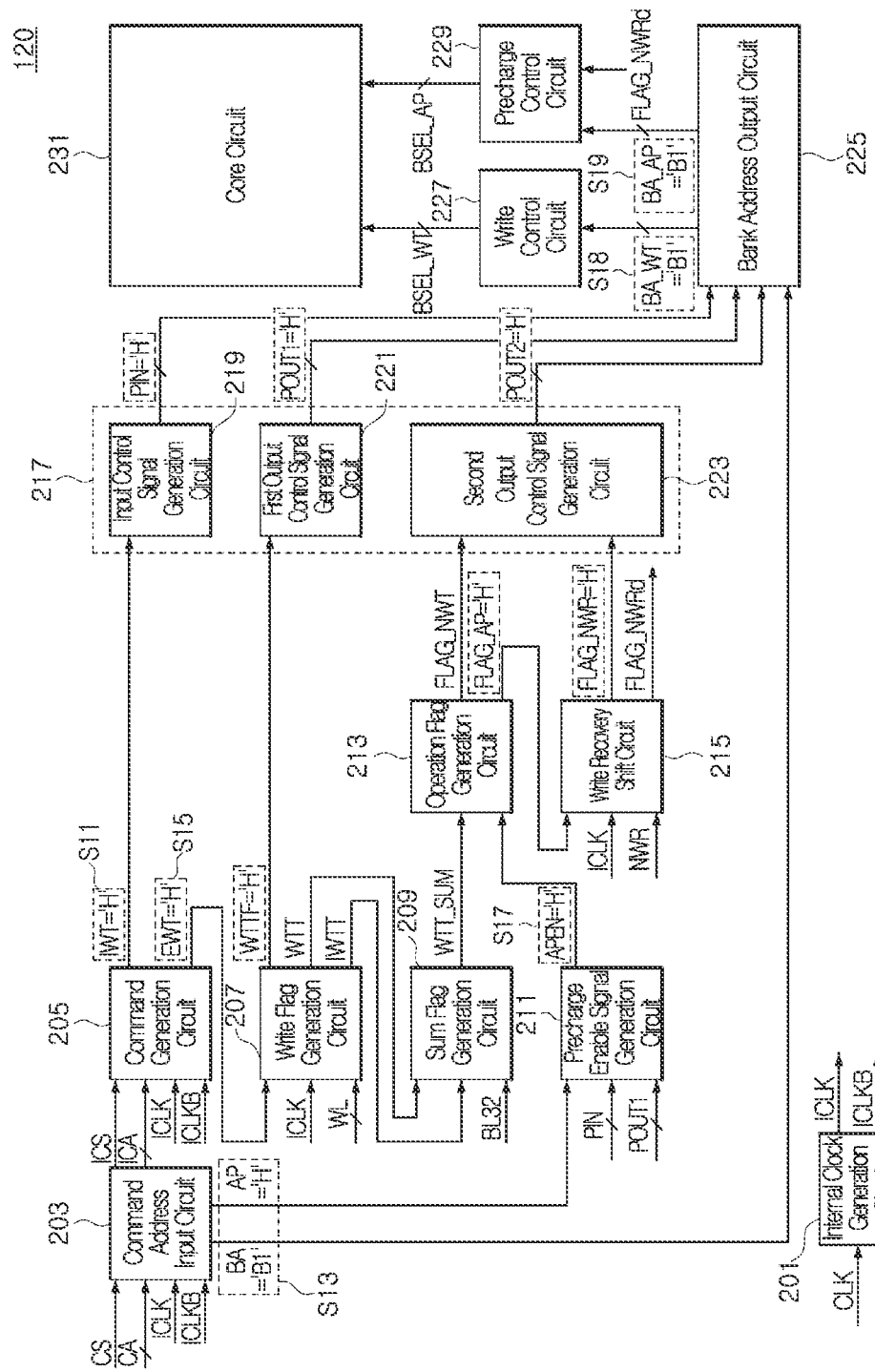
Figure 25:
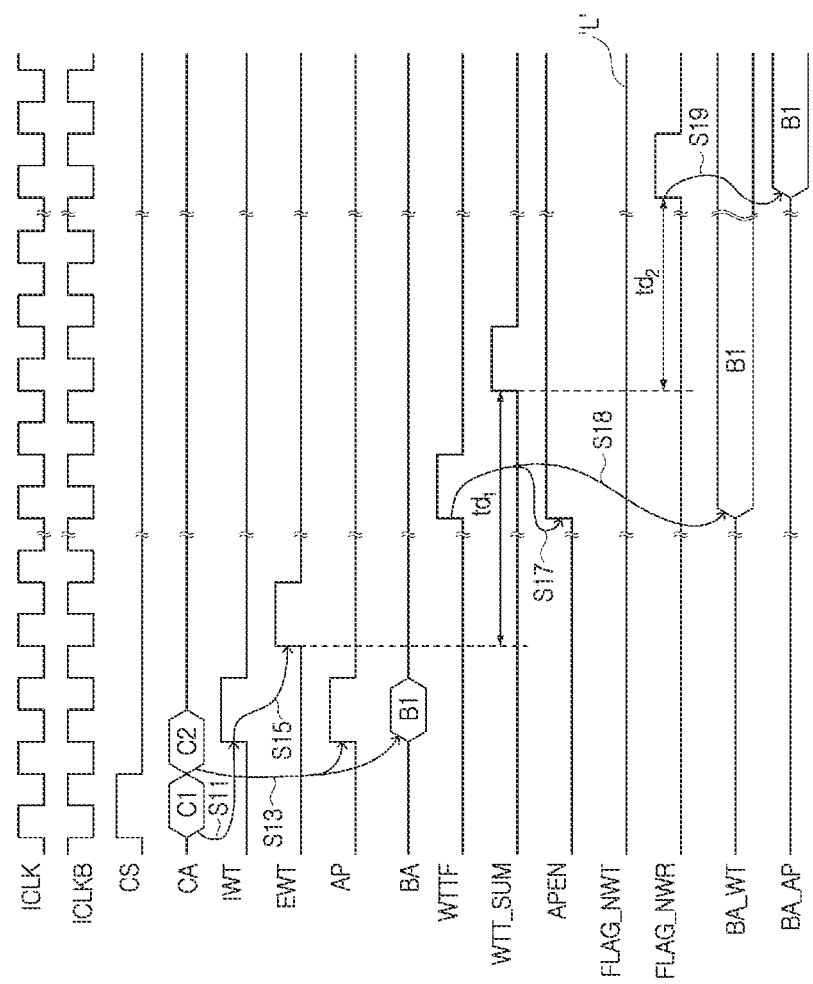

FIGS. 24 and 25 are diagrams for describing the operation of the electronic device 120 when the write operation with the auto-precharge operation is performed. As illustrated in FIGS. 24 and 25, the internal clock generation circuit 201 receives the clock signal CLK, and generates the internal clock signal ICLK and the inverted internal clock signal ICLKB. The command address input circuit 203 generates the internal chip select signal ICS from the chip select signal CS in synchronization with the internal clock signal ICLK, and generates the internal command address ICA from the command address CA having a logic level combination 'C1' for performing the write operation in synchronization with the internal clock signal ICLK. The command generation circuit 205 generates the write initialization signal (WT_INIT of FIG. 6) by decoding the internal chip select signal ICS and the internal command address ICA, and generates the internal write signal IWT by enabling the write initialization signal (WT_INIT of FIG. 6) to a logic high level 'H' in synchronization with the inverted internal clock signal ICLKB, in step S11. The command address input circuit 203 generates the bank address BA having a logic level combination 'B1' and the auto-precharge signal AP enabled to a logic high level 'H' from the command address CA having a logic level combination 'C2' in synchronization with the inverted internal clock signal ICLKB, in step S13. The input control signal generation circuit 219 generates the input control signal PIN enabled to a logic high level 'H', when the internal write signal IWT is enabled. The precharge enable signal generation circuit 211 latches the auto-precharge signal AP enabled in response to the enabled input control signal PIN. The bank address output circuit 225 latches the bank address BA having a logic level combination 'B1' in response to the enabled input control signal PIN.

The command generation circuit 205 generates the write signal EWT enabled to a logic high level 'H', based on the internal write signal IWT in synchronization with the internal clock signal ICLK, in step S15. The write flag generation circuit 207 generates the pre-write flag signal WTTF enabled to a logic high level 'H', by shifting the write signal EWT by an interval shorter by an interval of two periods of the internal clock signal ICLK than the interval td1 obtained by adding the write latency interval and an interval corresponding to the first burst length, in synchronization with the internal clock signal ICLK. The first output control signal generation circuit 221 generates the first output control signal POUT1 enabled to a logic high level 'H', when the pre-write flag signal WTTF is enabled. The precharge enable signal generation circuit 211 outputs the precharge enable signal APEN enabled to a logic high level 'H' in response to the enabled first output control signal POUT1, in step S17. The bank address output circuit 225 outputs the latched bank address BA as the write bank address BA_WT having a logic level combination 'B1' in response to the enabled first output control signal POUT1, in step S18.

The write flag generation circuit 207 generates the write flag signal WTT by shifting the write signal EWT by the interval td1 obtained by adding the write latency interval and the interval corresponding to the first burst length, in synchronization with the internal clock signal ICLK. The sum flag generation circuit 209 outputs the write flag signal WTT as the sum write flag signal WTT_SUM when the burst length is the first burst length. The operation flag generation circuit 213 generates the precharge flag signal FLAG_AP enabled to a logic high level 'H' from the sum write flag signal WTT_SUM in response to the enabled precharge enable signal APEN. The write recovery shift circuit 215 generates the recovery flag signal FLAG_NWR enabled to a logic high level 'H', by shifting the enabled precharge flag signal FLAG_AP by a write recovery interval td2. The second output control signal generation circuit 223 generates the second output control signal POUT2 enabled to a logic high level 'H' in response to the enabled recovery flag signal FLAG_NWR. The bank address output circuit 225 outputs the latched bank address BA as the precharge bank address BA_AP having a logic level combination 'B1' in response to the enabled second output control signal POUT2, in step S19.

As described above, the electronic device 120 in accordance with the present embodiment may share the bank address output circuit 225 for write, which outputs the write bank address BA_WT, and the bank address output circuit 225 for precharge, which outputs the precharge bank address BA_AP, when the write operation with the auto-precharge operation is performed, thereby reducing an area and power consumed by the bank address output circuit 225. The electronic device 120 in accordance with the present embodiment may share the input control signal generation circuit 219 for write and precharge, which controls an input of the bank address BA, when the write operation with the auto-precharge operation is performed, thereby reducing an area and power consumed by the input control signal generation circuit 219.

Figure 26:
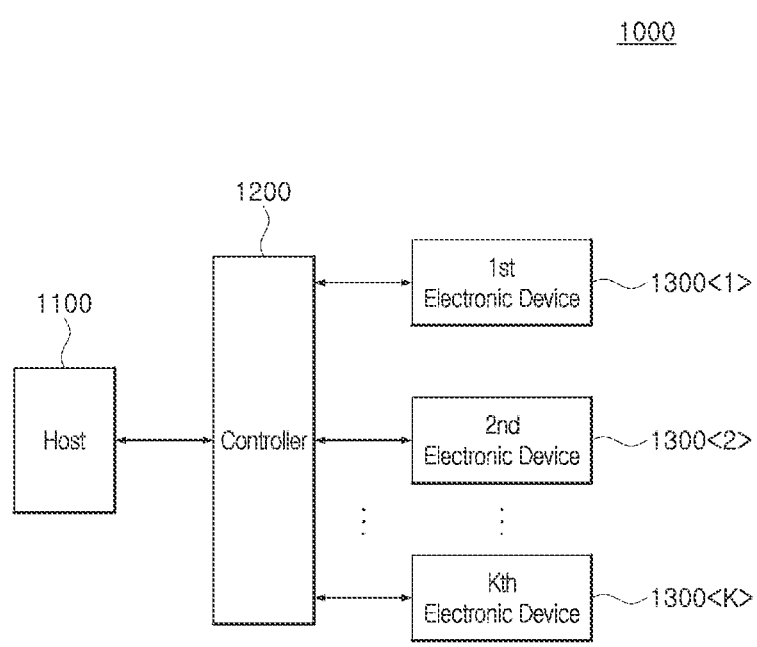
FIG. 26 is a block diagram illustrating a configuration of the electronic system illustrated in FIG. 1 in accordance with another embodiment.

FIG. 26 is a block diagram illustrating another embodiment of the electronic system 100 of FIG. 1. As illustrated in FIG. 26, an electronic system 1000 may include a host 1100, a controller 1200 and electronic devices 1300<1:K>. The controller 1200 may be implemented as the controller 110 illustrated in FIG. 1. Each of the electronic devices 1300(1:K) may be implemented as the electronic device 120 illustrated in FIG. 1. Here, K may be set to a natural number equal to or more than 3.

The host 1100 may transmit and receive signals to and from the controller 110 using an interface protocol. Examples of the interface protocol used between the host 1100 and the controller 1200 may include MMC (Multi-Media Card), ESDI (Enhanced Small Disk Interface), IDE (Integrated Drive Electronics), PCI-E (Peripheral Component Interconnect—Express), ATA (Advanced Technology Attachment), SATA (Serial ATA), PATA (Parallel ATA), SAS (serial attached SCSI) and USB (Universal Serial Bus).

The controller 1200 may control each of the electronic devices 1300<1:K> to perform various internal operations including the write operation and the auto-precharge operation. The controller 1200 may control each of the electronic devices 1300<1:K> to perform a normal write operation or the write operation with the auto-precharge operation.

Each of the electronic devices 1300<1:K> may share the bank address output circuit (225 of FIG. 2) for write and precharge, when the write operation with the auto-precharge operation is performed, thereby reducing an area and power consumed by the bank address output circuit 225 of FIG. 2. Furthermore, each of the electronic devices 1300<1:K> may share the input control signal generation circuit (219 of FIG. 2) for write and precharge, when the write operation with the auto-precharge operation is performed, thereby reducing an area and power consumed by the input control signal generation circuit (219 of FIG. 2).

According to an embodiment, each of the electronic devices 1300(1:K) may be implemented as a DRAM (dynamic random access memory), PRAM (Phase-change Random Access Memory), RRAM (Resistive Random Access Memory), MRAM (Magnetic Random Access Memory) or FRAM (Ferroelectric Random Access Memory).

While various embodiments have been described above, it will be understood to those skilled in the art that the embodiments described are examples only. Accordingly, the electronic device described herein should not be limited based on the described embodiments.

What is claimed is:

1. An electronic device comprising:
an input/output control signal generation circuit configured to generate an input control signal and a first output control signal during a write operation, and generate a second output control signal during a write operation with an auto-precharge operation; and
a bank address output circuit configured to latch a bank address based on the input control signal, and output the latched bank address as at least one of a write bank address for the write operation and a precharge bank address for the auto-precharge operation, based on the first output control signal and the second output control signal,
wherein the second output control signal is disabled when the write operation is performed and the auto-precharge operation is not performed.

2. The electronic device of claim 1, wherein the input control signal is enabled to control an input of the bank address when an internal write signal generated during the write operation is enabled.

3. The electronic device of claim 2, further comprising a command generation circuit configured to generate a write initialization signal by decoding an internal command address and an internal chip select signal having a logic level for performing the write operation, and generate the internal write signal by synchronizing the write initialization signal with an inverted internal clock signal.

4. The electronic device of claim 1, wherein the first output control signal is enabled to control an output of the write bank address when a pre-write flag signal is enabled.

5. The electronic device of claim 4, wherein the pre-write flag signal is generated by shifting a write signal, generated during the write operation, by an interval shorter than an interval obtained by adding a write latency interval and an interval corresponding to a burst length.

6. The electronic device of claim 1, wherein the write operation with the auto-precharge operation is performed when a write signal for performing the write operation is enabled and an auto-precharge signal for performing the auto-precharge operation is enabled.

7. The electronic device of claim 1, wherein the second output control signal is disabled when a normal write operation is performed, and enabled to control an output of the precharge bank address when the write operation with the auto-precharge operation is performed.

8. The electronic device of claim 7, wherein the normal write operation is performed when a write signal for performing the write operation is enabled and an auto-precharge signal for performing the auto-precharge operation is disabled.

9. The electronic device of claim 1, wherein the input/output control signal generation circuit comprises:
an input control signal generation circuit configured to generate the input control signal when an internal write signal is input during the write operation;

a first output control signal generation circuit configured to generate the first output control signal when a pre-write flag signal is input during the write operation; and a second output control signal generation circuit configured to generate the second output control signal based on a normal write flag signal and a recovery flag signal, when the write operation with the auto-precharge operation is performed.

10. The electronic device of claim 9, wherein the normal write flag signal is enabled when the normal write operation is performed, and the recovery flag signal is enabled when the write operation with the auto-precharge operation is performed.

11. The electronic device of claim 9, wherein the second output control signal generation circuit comprises:
   a signal summing circuit configured to generate a sum count input signal by summing the normal write flag signal and the recovery flag signal;
   a count circuit configured to generate a count output signal by counting the number of times that the sum count input signal is input; and
   an output control circuit configured to output the count output signal as the second output control signal when the recovery flag signal is enabled.

12. The electronic device of claim 9, further comprising: an operation flag generation circuit configured to output a sum write flag signal as one of the normal write flag signal and a precharge flag signal, depending on whether the auto-precharge operation is performed based on a precharge enable signal; and a write recovery shift circuit configured to generate the recovery flag signal by shifting the precharge flag signal by a write recovery interval.

13. The electronic device of claim 12, wherein the precharge enable signal is enabled from a point of time that the pre-write flag signal is enabled, when the write operation with the auto-precharge operation is performed.

14. The electronic device of claim 12, wherein the sum write flag signal is generated by shifting the write signal, generated during the write operation, by an interval obtained by adding a write latency interval and an interval corresponding to a burst length.

15. An electronic device comprising:
   an input control signal generation circuit configured to generate an input control signal when an internal write signal is input during a write operation;
   an output control signal generation circuit configured to generate an output control signal based on a normal write flag signal and a recovery flag signal, when a write operation with an auto-precharge operation is performed; and
   a bank address output circuit configured to latch a bank address based on the input control signal and output the latched bank address as a precharge bank address for the auto-precharge operation, based on the output control signal,
   wherein the output control signal is disabled when the write operation is performed and the auto-precharge operation is not performed.

16. The electronic device of claim 15, further comprising a command generation circuit configured to generate a write initialization signal by decoding an internal command address and an internal chip select signal having a logic level for performing the write operation, and generate the internal write signal by synchronizing the write initialization signal with an inverted internal clock signal.

17. The electronic device of claim 15, wherein the write operation with the auto-precharge operation is performed when a write signal for performing the write operation is enabled and an auto-precharge signal for performing the auto-precharge operation is enabled.

18. The electronic device of claim 15, wherein the normal write flag signal is enabled when a normal write operation is performed, and the recovery flag signal is enabled when the write operation with the auto-precharge operation is performed.

19. The electronic device of claim 18, wherein the normal write operation is performed when the write signal for performing the write operation is enabled and the auto-precharge signal for performing the auto-precharge operation is disabled.

20. The electronic device of claim 15, wherein the output control signal generation circuit comprises:
   a signal summing circuit configured to generate a sum count input signal by summing the normal write flag signal and the recovery flag signal;
   a count circuit configured to generate a count output signal by counting the number of times that the sum count input signal is input; and
   an output control circuit configured to output the count output signal as the output control signal when the recovery flag signal is enabled.

21. The electronic device of claim 15, further comprising: an operation flag generation circuit configured to output a sum write flag signal as one of the normal write flag signal and a precharge flag signal, depending on whether the auto-precharge operation is performed; and a write recovery shift circuit configured to generate the recovery flag signal by shifting the precharge flag signal by a write recovery interval.

22. The electronic device of claim 21, wherein the sum write flag signal is generated by shifting the write signal, generated during the write operation, by an interval obtained by adding a write latency interval and an interval corresponding to a burst length.

* * * * *